United States Patent
Aggarwal et al.

(10) Patent No.: US 8,486,191 B2
(45) Date of Patent: Jul. 16, 2013

(54) SUBSTRATE REACTOR WITH ADJUSTABLE INJECTORS FOR MIXING GASES WITHIN REACTION CHAMBER

(75) Inventors: Ravinder Aggarwal, Gilbert, AZ (US); Rand Conner, Chandler, DE (US); John Disanto, Scottsdale, AZ (US); James A. Alexander, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 295 days.

(21) Appl. No.: 12/420,010

(22) Filed: Apr. 7, 2009

(65) Prior Publication Data

US 2010/0255658 A1 Oct. 7, 2010

(51) Int. Cl.
| | |
|---|---|
| C23C 16/455 | (2006.01) |
| C23C 16/52 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl.
USPC .................. 118/715; 156/345.33

(58) Field of Classification Search
USPC .................. 118/715; 156/345.33
See application file for complete search history.

(56) References Cited

U.S. PATENT DOCUMENTS

| | | | |
|---|---|---|---|
| 2,761,853 A | 9/1956 | Uraneck et al. | |
| 2,860,173 A | 11/1958 | Jones et al. | |
| 3,377,395 A | 4/1968 | Christoph, Jr. | |
| 4,058,430 A | 11/1977 | Suntola et al. | |
| 4,161,462 A | 7/1979 | Bocharov et al. | |
| 4,369,031 A | 1/1983 | Goldman et al. | |
| 4,413,022 A | 11/1983 | Suntola et al. | |
| 4,612,077 A | 9/1986 | Tracy et al. | |
| 4,656,021 A | 4/1987 | Tanabe et al. | |
| 4,747,367 A | 5/1988 | Posa | |
| 4,761,269 A * | 8/1988 | Conger et al. ................ | 118/679 |
| 4,793,283 A | 12/1988 | Sarkozy | |
| 4,854,263 A | 8/1989 | Chang et al. | |
| 4,902,572 A | 2/1990 | Horne et al. | |
| 4,980,204 A | 12/1990 | Fujii et al. | |
| 5,024,182 A | 6/1991 | Kobayashi et al. | |
| 5,071,670 A | 12/1991 | Kelly | |

(Continued)

FOREIGN PATENT DOCUMENTS

| | | |
|---|---|---|
| DE | 19820147 A1 | 7/1999 |
| DE | 10026180 | 12/2001 |

(Continued)

OTHER PUBLICATIONS

Abeles et al.; *Amorphous Semiconductor Superlattices;* Physical Review Letters; Nov. 21, 1983; pp. 2003-2006; vol. 51; No. 21.

(Continued)

*Primary Examiner* — Rudy Zervigon
(74) *Attorney, Agent, or Firm* — Knobbe Martens Olson & Bear LLP

(57) ABSTRACT

Methods and apparatuses for separately injecting gases into a reactor for a substrate processing system. The flow profiles of the gases are controlled with two or more sets of adjustable gas flow injectors. The methods are particularly useful for selective deposition of gases in a CVD system using volatile combinations of precursors and etchants. In either case, the gases are provided along separate flow paths that intersect in a relatively open reaction space, rather than in more confined upstream locations.

29 Claims, 14 Drawing Sheets

U.S. PATENT DOCUMENTS

| | | |
|---|---|---|
| 5,112,439 A | 5/1992 | Reisman et al. |
| 5,194,398 A | 3/1993 | Miyachi et al. |
| 5,221,556 A * | 6/1993 | Hawkins et al. ......... 427/255.17 |
| 5,250,323 A | 10/1993 | Miyazaki |
| 5,269,847 A | 12/1993 | Anderson et al. |
| 5,304,247 A | 4/1994 | Kondo et al. |
| 5,306,666 A | 4/1994 | Izumi |
| 5,411,590 A * | 5/1995 | Hawkins et al. ............... 118/715 |
| 5,413,671 A | 5/1995 | Ketchum |
| 5,421,288 A * | 6/1995 | Ohta et al. ....................... 117/88 |
| 5,453,124 A | 9/1995 | Moslehi et al. |
| 5,455,070 A | 10/1995 | Anderson et al. |
| 5,487,358 A * | 1/1996 | Ohta et al. ..................... 117/200 |
| 5,525,157 A * | 6/1996 | Hawkins et al. ............... 118/715 |
| 5,551,982 A | 9/1996 | Anderson et al. |
| 5,674,781 A | 10/1997 | Huang et al. |
| 5,698,070 A * | 12/1997 | Hirano et al. .................. 438/729 |
| 5,702,530 A | 12/1997 | Shan et al. |
| 5,711,811 A | 1/1998 | Suntola et al. |
| 5,769,950 A | 6/1998 | Takasu et al. |
| 5,831,335 A | 11/1998 | Miyamoto |
| 5,849,092 A | 12/1998 | Xi et al. |
| 5,851,589 A | 12/1998 | Nakayama et al. |
| 5,879,459 A | 3/1999 | Gadgil et al. |
| 5,888,907 A | 3/1999 | Tomoyasu et al. |
| 5,904,565 A | 5/1999 | Nguyen et al. |
| 5,916,365 A | 6/1999 | Sherman |
| 5,933,761 A | 8/1999 | Lee |
| 5,948,168 A | 9/1999 | Shan et al. |
| 5,948,958 A | 9/1999 | Bang et al. |
| 5,976,261 A | 11/1999 | Moslehi et al. |
| 6,003,535 A | 12/1999 | Ollivier |
| 6,013,155 A | 1/2000 | McMillin et al. |
| 6,015,590 A | 1/2000 | Suntola et al. |
| 6,022,412 A | 2/2000 | Vincenzo et al. |
| 6,037,258 A | 3/2000 | Liu et al. |
| 6,042,654 A | 3/2000 | Comita et al. |
| 6,048,790 A | 4/2000 | Iacoponi et al. |
| 6,069,068 A | 5/2000 | Rathore et al. |
| 6,077,775 A | 6/2000 | Stumborg et al. |
| 6,083,818 A | 7/2000 | Stumborg et al. |
| 6,093,252 A | 7/2000 | Wengert et al. |
| 6,093,368 A | 7/2000 | Rafferty et al. |
| 6,100,184 A | 8/2000 | Zhao et al. |
| 6,139,700 A | 10/2000 | Kang et al. |
| 6,143,080 A | 11/2000 | Bartholomew et al. |
| 6,146,517 A | 11/2000 | Hoinkis |
| 6,148,761 A | 11/2000 | Majewski et al. |
| 6,162,323 A * | 12/2000 | Koshimizu ............... 156/345.26 |
| 6,181,012 B1 | 1/2001 | Edelstein et al. |
| 6,184,128 B1 | 2/2001 | Wang et al. |
| 6,185,839 B1 * | 2/2001 | Kholodenko et al. .......... 34/255 |
| 6,188,134 B1 | 2/2001 | Stumborg et al. |
| 6,200,893 B1 | 3/2001 | Sneh |
| 6,203,613 B1 | 3/2001 | Gates et al. |
| 6,207,487 B1 | 3/2001 | Kim et al. |
| 6,207,567 B1 | 3/2001 | Wang et al. |
| 6,217,659 B1 | 4/2001 | Botelho et al. |
| 6,225,213 B1 | 5/2001 | Urabe |
| 6,270,572 B1 | 8/2001 | Kim et al. |
| 6,287,965 B1 | 9/2001 | Kang et al. |
| 6,291,876 B1 | 9/2001 | Stumborg et al. |
| 6,303,523 B2 | 10/2001 | Cheung et al. |
| 6,328,221 B1 | 12/2001 | Moore et al. |
| 6,333,272 B1 | 12/2001 | McMillin et al. |
| 6,340,619 B1 | 1/2002 | Ko |
| 6,342,448 B1 | 1/2002 | Lin et al. |
| RE37,546 E | 2/2002 | Mahawili |
| 6,347,749 B1 | 2/2002 | Moore et al. |
| 6,351,039 B1 | 2/2002 | Jin et al. |
| 6,352,594 B2 | 3/2002 | Cook et al. |
| 6,358,829 B2 | 3/2002 | Yoon et al. |
| 6,368,954 B1 | 4/2002 | Lopatin et al. |
| 6,380,065 B1 | 4/2002 | Komai et al. |
| 6,383,954 B1 * | 5/2002 | Wang et al. .................... 438/789 |
| 6,391,785 B1 | 5/2002 | Satta et al. |
| 6,399,491 B2 | 6/2002 | Jeon et al. |
| 6,444,495 B1 | 9/2002 | Leung et al. |
| 6,482,733 B2 | 11/2002 | Raaijmakers et al. |
| 6,511,539 B1 | 1/2003 | Raaijmakers |
| 6,521,048 B2 | 2/2003 | Miller et al. |
| 6,531,347 B1 | 3/2003 | Huster et al. |
| 6,555,839 B2 | 4/2003 | Fitzgerald |
| 6,562,140 B1 | 5/2003 | Bondestam et al. |
| 6,572,924 B1 | 6/2003 | Halpin |
| 6,583,015 B2 | 6/2003 | Fitzgerald et al. |
| 6,583,048 B1 | 6/2003 | Vincent et al. |
| 6,593,191 B2 | 7/2003 | Fitzgerald |
| 6,716,713 B2 | 4/2004 | Todd |
| 6,727,169 B1 | 4/2004 | Raaijmakers et al. |
| 6,820,570 B2 | 11/2004 | Kilpela et al. |
| 6,821,825 B2 | 11/2004 | Todd et al. |
| 6,900,115 B2 | 5/2005 | Todd |
| 6,927,140 B2 * | 8/2005 | Soman et al. .................. 438/309 |
| 6,958,253 B2 | 10/2005 | Todd |
| 6,962,859 B2 | 11/2005 | Todd et al. |
| 6,969,875 B2 | 11/2005 | Fitzgerald |
| 7,020,981 B2 | 4/2006 | Shero et al. |
| 7,026,219 B2 | 4/2006 | Pomarede et al. |
| 7,071,127 B2 | 7/2006 | Dong et al. |
| 7,091,522 B2 | 8/2006 | Lee et al. |
| 7,132,338 B2 | 11/2006 | Samoilov et al. |
| 7,166,528 B2 | 1/2007 | Kim et al. |
| 7,186,630 B2 | 3/2007 | Todd |
| 7,195,985 B2 | 3/2007 | Murthy et al. |
| 7,208,362 B2 | 4/2007 | Chidambaram |
| 7,235,492 B2 | 6/2007 | Samoilov |
| 7,237,460 B2 | 7/2007 | Hu |
| 7,273,526 B2 | 9/2007 | Shinriki et al. |
| 7,307,273 B2 | 12/2007 | Currie |
| 7,312,128 B2 | 12/2007 | Kim et al. |
| 7,335,545 B2 | 2/2008 | Currie |
| 7,655,543 B2 * | 2/2010 | Bauer ........................... 438/478 |
| 7,682,947 B2 * | 3/2010 | Brabant et al. ................ 438/481 |
| 7,732,305 B2 | 6/2010 | Ye et al. |
| 7,740,704 B2 * | 6/2010 | Strang .......................... 118/715 |
| 7,806,078 B2 * | 10/2010 | Yoshida ..................... 118/723 I |
| 7,897,491 B2 * | 3/2011 | Bauer ........................... 438/478 |
| 7,939,447 B2 * | 5/2011 | Bauer et al. ................... 438/680 |
| 7,960,256 B2 | 6/2011 | Ye et al. |
| 8,067,061 B2 * | 11/2011 | Aggarwal et al. .......... 427/248.1 |
| 8,088,223 B2 * | 1/2012 | Todd et al. .................... 118/715 |
| 2001/0001742 A1 | 5/2001 | Huang et al. |
| 2001/0009138 A1 | 7/2001 | Botelho et al. |
| 2001/0013363 A1 | 8/2001 | Kitayama et al. |
| 2001/0034123 A1 | 10/2001 | Jeon et al. |
| 2002/0023520 A1 | 2/2002 | Hu |
| 2002/0042205 A1 | 4/2002 | McMillin et al. |
| 2002/0168868 A1 | 11/2002 | Todd |
| 2003/0033979 A1 * | 2/2003 | Kholodenko et al. ......... 118/715 |
| 2003/0075273 A1 | 4/2003 | Kilpela et al. |
| 2004/0035358 A1 | 2/2004 | Basceri et al. |
| 2004/0041216 A1 | 3/2004 | Mori |
| 2004/0043636 A1 | 3/2004 | Vaartstra et al. |
| 2004/0048439 A1 * | 3/2004 | Soman et al. .................. 438/309 |
| 2004/0107897 A1 | 6/2004 | Lee et al. |
| 2004/0142558 A1 | 7/2004 | Granneman |
| 2004/0216665 A1 | 11/2004 | Soininen et al. |
| 2004/0216668 A1 | 11/2004 | Lindfors et al. |
| 2004/0219735 A1 * | 11/2004 | Brabant et al. ................ 438/222 |
| 2004/0224089 A1 | 11/2004 | Singh et al. |
| 2004/0235295 A1 | 11/2004 | Dong et al. |
| 2004/0262694 A1 | 12/2004 | Chidambaram |
| 2005/0023520 A1 | 2/2005 | Lee et al. |
| 2005/0061243 A1 | 3/2005 | Sarigiannis et al. |
| 2005/0079691 A1 | 4/2005 | Kim et al. |
| 2005/0079692 A1 | 4/2005 | Samoilov et al. |
| 2005/0092247 A1 | 5/2005 | Schmidt et al. |
| 2005/0150454 A1 | 7/2005 | Li et al. |
| 2005/0250298 A1 | 11/2005 | Bauer |
| 2006/0011984 A1 | 1/2006 | Currie |
| 2006/0014366 A1 | 1/2006 | Currie |
| 2006/0115933 A1 | 6/2006 | Ye et al. |
| 2006/0115934 A1 | 6/2006 | Kim et al. |
| 2006/0148151 A1 | 7/2006 | Murthy et al. |
| 2006/0166414 A1 | 7/2006 | Carlson et al. |
| 2006/0169668 A1 | 8/2006 | Samoilov |

| | | | |
|---|---|---|---|
| 2006/0169669 A1 | 8/2006 | Zojaji et al. | |
| 2006/0205194 A1 | 9/2006 | Bauer | |
| 2006/0216417 A1* | 9/2006 | Todd et al. | 427/248.1 |
| 2006/0234504 A1 | 10/2006 | Bauer et al. | |
| 2006/0240630 A1 | 10/2006 | Bauer et al. | |
| 2006/0266289 A1 | 11/2006 | Verghese et al. | |
| 2006/0275546 A1 | 12/2006 | Arena et al. | |
| 2006/0289900 A1 | 12/2006 | Thirupapuliyur et al. | |
| 2007/0015374 A1 | 1/2007 | Granneman | |
| 2007/0101939 A1* | 5/2007 | Sumakeris et al. | 118/724 |
| 2007/0259112 A1 | 11/2007 | Ishikawa et al. | |
| 2007/0287272 A1 | 12/2007 | Bauer et al. | |
| 2008/0026149 A1 | 1/2008 | Tomasini et al. | |
| 2008/0202416 A1 | 8/2008 | Provencher et al. | |
| 2009/0111246 A1 | 4/2009 | Bauer et al. | |
| 2009/0163001 A1* | 6/2009 | Bauer | 438/504 |
| 2009/0260572 A1* | 10/2009 | Kim et al. | 118/730 |
| 2010/0255658 A1* | 10/2010 | Aggarwal et al. | 438/478 |
| 2011/0230036 A1 | 9/2011 | Ye et al. | |

FOREIGN PATENT DOCUMENTS

| | | |
|---|---|---|
| EP | 1024210 | 8/2000 |
| JP | 03131594 | 6/1991 |
| JP | 04-252023 | 3/1992 |
| JP | 04-085818 | 9/1992 |
| JP | 06151338 | 5/1994 |
| JP | 08-139017 | 5/1996 |
| JP | 2006253696 A * | 9/2006 |
| TW | 200305202 | 10/2003 |
| WO | WO 89/12703 | 12/1989 |
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 A3 | 12/2000 |
| WO | WO 00/79576 A1 | 12/2000 |
| WO | WO 01/15220 A1 | 3/2001 |
| WO | WO 01/36702 A1 | 5/2001 |
| WO | WO 01/45149 A1 | 6/2001 |
| WO | WO 01/66832 | 9/2001 |
| WO | WO 01/78123 A1 | 10/2001 |
| WO | WO 01/78124 A1 | 10/2001 |
| WO | WO 01/99166 A1 | 12/2001 |
| WO | WO 2004/025716 | 3/2004 |

OTHER PUBLICATIONS

Antonell et al., "Carbon incorporation for strain compensation during solid phase epitaxial recrystallization of SiGe on Si at 500-600°C", J. Appl. Phys. 79 (10), pp. 7646-7651 (1996).

Aoyama, T., "Si Selective Epitaxial Growth Using Cl2 Pulsed Molecular Flow Method," Thin Solid Films 321 (1998) 256-260, © 1998 Elsevier Science S.A.

Bauer et al., "$Si_3H_8$ based epitaxy of biaxially stressed silicon films doped with carbon and arsenic for CMOS applications", in Semiconductor Defect Engineering—Materials, Synthetic Structures and Devices, edited by S. Ashok, J. Chevallier, B.L. Sopori, M. Tabe, and P. Kiesel (Mater. Res. Soc. Symp. Proc. 864, Warrendale, PA, 2005), E4.30.

Bauer et al., "Time resolved reflectivity measurements of silicon solid phase epitaxial regrowth", Thin Solid Films 364, pp. 228-232 (2000).

Bedair; *Selective area and sidewall growth by atomic layer epitaxy;* Semicond Sci. Technol; 1993; 1052-1062; vol. 8.

Düscö et al.; *Deposition of Tin Oxide into Porous Silicon by Atomic Layer Epitaxy;* J. Electrochem. Soc.; Feb. 1996; pp. 683-687; vol. 143, No. 2.

Eberl et al.; "Structural properties of SiC and SiGeC alloy layers on Si", Chapter 2.5 in "Properties of Silicon Germanium and SiGe:Carbon", Institution of Electrical Engineers, pp. 75-77 (1999).

Fazan et al.; *A High-C Capacitor (20.4 Ff/μm2) with Ultrathin CVD—Ta2O5 Films Deposited on Rugged Poly-Si for High Density DRAMs;* IEEE; 1992; pp. IDEM 92-263-IDEM 92-266.

Feng et al., "Raman determination of layer stresses and strains for heterostructures and its application to the cubic SiC/Si system", J. Appl. Phys. 64 (12), pp. 6827-6835 (1988).

George et al.; *Nucleation and Growth During Tungsten Atomic Layer Deposition on Oxide Surfaces;* Mat. Res. Symp. Proc. vol. 672; Materials Research Society 2001; 07.7.1-07.7.7.

Haukka et al.; *Chemisorption of chromium acetylacetonate on porous high surface area silica;* Applied Surface Science; 1994; pp. 220-227.

Hiltunen et al.; *Nitrides of Titanium, Niobium, Tantalum and Molybdenum Grown as Thin Films by the Atomic Layer Epitaxy Method;* Thin Solid Films; 1988; pp. 149-154; vol. 166.

Horiike et al.; *Filling of Si Oxide into a Deep Trench using Digital CVD Method;* Applied Surface Science; 1990; pp. 168-174; vol. 46.

Hoyt, "Substitutional carbon incorporation and electronic characterization of $Si_{1-y}C_y$/Si and $Si_{1-x-y}Ge_xC_y$/Si heterojunctions", Chapter 3 in "Silicon-Germanium Carbon Alloy", Taylor and Francis (New York, NY), pp. 59-89 (2002).

Jin et al.; *Porous Silica Xerogel Processing and Integration for ULSI Applications;* Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Juppo et al.; *Deposition of copper films by an alternate supply of CuCl and Zn;* J. Vac. Sci. Technol.; 1997; pp. 2003; vol.-issue A 15(4).

Kaizuka et al.; *Conformal Chemical Vapor Deposition TiN(111) Film Formation as an Underlayer of Al for Highly Reliable Interconnects;* Jpn. J. Appl. Phys.; 1994; pp. 470-474; vol. 33.

Kikkawa et al.; *A Quarter-Micrometer Interconnection Technology Using a TiN/Al-Si-Cu/TiN/Al-Si-Cu/TiN/Ti Multilayer Structure;* IEEE Transactions on Electron Devices; Feb. 1993; pp. 296-302; vol. 40, No. 2.

Kikkawa et al.; *Al-Si-Cu/TiN multilayer interconnection and Al-Ge reflow sputtering technologies for quarter-micron devices;* SPIE; 1992; pp. 54-64; vol. 1805.

Kim et al.; *Applicability of ALE Tin films as Cu/Si diffusion barriers;* Thin Solid Films; 2000; pp. 276-283; 372(1).

Kim et al.; *Comparison of TiN and TiAlN as a Diffusion Barrier Deposited by Atomic Layer Deposition;* Journal of the Korean Physical Society; 2002; pp. 176-179; 40(1).

Klaus et al.; *Atomic Layer Deposition of SiO2 Using Catalyzed and Uncatalyzed Self-Limiting Surface Reactions;* Surface Review and Letters; 1999; pp. 435-448; vol. 6, Nos. 3 & 4.

Klaus et al.; *Atomic Layer Deposition of Tungsten Nitride Films Using Sequential Surface Reactions;* J. Electrochem Soc.; 2000; 1175-1181; 147(3).

Klaus et al.; *Atomically controlled growth of tungsten and tungsten nitride using sequential surface reactions;* Applied Surface Science; 2000; pp. 479-491; Vols. 162-163.

Koo et al.; *Study on the characteristics of Ti AlN thin film deposited by atomic layer deposition method;* Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

Kukli et al.; *Atomic Layer Epitaxy Growth of Tantalum Oxide Thin Films from Ta(OC2H5)5 and H2O;* J. Electrochem. Soc.; May 1995; pp. 1670-1674; vol. 142, No. 5.

Leskelä et al.; *Atomic Layer Epitaxy in Deposition of Various Oxide and Nitride Thin Films;* Journal De Physique IV, Colloque C5, supplement au Journal de Physique II; Jun. 1995; pp. C5-937-C5-951; vol. 5.

MacKnight et al., "RTP applications and technology options for the sub-45 nm node", Proceedings, RTP2004 Conference (Portland, OR) (2004).

Martensson et al.; *Atomic layer epitaxy of copper an ab inition investigation of the CuCl/H2 process Ill. Reaction barriers;* Appl. Surf. Sci.; 2000; 92-100; 157(1).

Martensson et al.; *Atomic Layer Epitaxy of Copper on Tantalum;* Chemical Vapor Deposition; 1997; pp. 45-50; vol. 3, No. 1.

Martensson et al.; *Atomic Layer Epitaxy of Copper, Growth and Selectivity in the Cu(ll)-2,2,6, 6-tetramethyl-3,5-heptanedionate/H2 Process;* J. Electrochem. Soc.; Aug. 1998; pp. 2926-2931; vol. 145, No. 8.

Martensson et al.; *CU(THD)2 as Copper Source in Atomic Layer Epitaxy;* Proc. Electrochem. Soc.; 1997; 1529-1536; 97-25.

Martensson et al.; *Use of Atomic Layer Epitaxy for Fabrication of Si/TiN/Cu Structures;* J. Vac. Sci. Technol. B, Sep./Oct. 1999; pp. 2122-2128; vol. 17, No. 5.

Meléndez-Lira et al., "Substitutional carbon in $Si_{1-y}C_y$ alloys as measured with infrared absorption and Raman spectroscopy", J. Appl. Phys. 82, pp. 4246-4252 (1997).

Min et al.; *Atomic Layer Deposition of TiN Films by Alternate Supply of Tetrakis (ethylmethylarnino)—Titanium and Ammonia;* Japanese Journal of Applied Physics; 1998; pp. 4999-5004; vol. 37.

Min et al.; *Chemical Vapor Deposition of Ti-Si-N Films with Alternating Source Supply;* Mat. Res. Soc. Symp. Proc.; 1999; pp. 207-210; vol. 564; Materials Research Society.

Min et al.; *Metal-Organic Atomic-Layer Deposition of Titanium-Silicon-Nitride Films;* Applied Physics Letters; 1999; pp. 1521-1523; vol. 75, No. 11.

Min; *Atomic Layer Deposition of TiN Thin Films by Sequential Introduction of Ti Precursor and NH3;* Materials Research Society Symposium Proceedings; 1998; pp. 337-343; vol. 514.

Moller; *Copper and Nickel Ultrathin Films on Metal-Oxide Crystal Surfaces* Mater. Soc. Monogr.; 1994; 473-522; 81.

Niinistö et al.; *Synthesis of oxide thin films and overlayers by atomic layer epitaxy for advanced applications;* Materials Science and Engineering; 1996; pp. 23-29; vol. B41.

Oehme et al., "A novel measurement method of segregating adlayers in MBE", Thin Solid Films 369, pp. 138-142 (2000).

Oehme et al., "Carbon segregation in silicon", Thin Solid Films 380, pp. 75-77 (2000).

O'Neil et al., "Optimization of process conditions for selective silicon epitaxy using disilane, hydrogen, and chlorine", J. Electrochem. Soc. 144 (9), pp. 3309-3315 (1997).

Osten et al., "Substitutional carbon incorporation in epitaxial $Si_{1-y}C_y$ alloys on Si(001) grown by molecular beam epitaxy", Applied Physics Letters 74 (6), pp. 836-838 (1999).

Osten et al., "Substitutional versus interstitial carbon incorporation during psuedomorphic growth of $Si_{1-y}C_y$ on Si(001)", J. Appl. Phys. 80 (12), pp. 6711-6715 (1996).

Ott et al.; *Modification of Porous Alumina membranes Using Al2O3 Atomic Layer Controlled Deposition;* Chem. Mater.; 1997; pp. 707-714; vol. 9.

PCT Search Report, PCT Application PCT/US2006/003333; Jun. 30, 2006.

PCT Search Report, PCT Application PCT/US2006/003465; Jul. 7, 2006.

Ritala et al.; *Atomic Layer Epitaxy Growth of TiN Thin Films from Tila and NH3;* J. Electrochem. Soc.; Aug. 1998; pp. 2914-2920; vol. 145; No. 8.

Ritala et al.; *Controlled Growth of TaN, Ta3N5, and TaOxNy Thin Filims by Atomic Layer Deposition;* Chem. Mater.; 1999; pp. 1712-1718; vol. 11.

Ritala et al.; *Effects of intermediate zinc pulses on properties of TiN and NbN films deposited by atomic layer epitaxy;* Appl. Surf. Sci.; 1997; 199-212; 120.

Ritala et al.; *Perfectly Conformal TiN and Al2O3 Films Deposited by Atomic Layer Deposition;* ChemVap. Deposition; 1999; pp. 7-9; vol. 5, No. 1.

Rossnagel et al.; *Plasma-enhanced atomic layer deposition of Ta and Ti for interconnect diffusin barriers;* J. Vac. Sci. Technol.; 2000; 2016-2020; 18(4).

Ryan et al.; *Material Property Characterization and Integration Issues for Mesoporous Silica;* IEEE, 1999, pp. IITC 99-187-IITC 99-189.

Sakaue et al.; *Digital Chemical Vapor Deposition of SiO2 Using a Repetitive Reaction of Triethylsilane/Hydrogen and Oxidation;* Japanese Journal of Applied Physics; Jan. 1990; pp. L124-L127; vol. 30, No. 1B.

Singer; *Atomic Layer Deposition Targets Thin Films;* Semiconductor International; Sep. 1999; pp. 40.

Sneh et al.; *Atomic layer growth of SiO2 on Si(100) using SiCl4 and H2O in a binary reaction sequence;* Surface Science; 1995; pp. 135-152; vol. 334.

Solanki et al.; *Atomic Layer Deposition of Copper Seed Layers;* Electrochem. and Solid State Lett.; 2000; 479-480; 3(10).

Strane et al., "Carbon incorporation into Si at high concentrations by ion implantation and solid phase epitaxy", J. Appl. Phys. 79 (2), pp. 637-646 (1996).

Strane et al., "Precipitation and relaxation in strained $Si_{1-y}C_y$/Si heterostructures", J. Appl. Phys. 76 (6), pp. 3656-3668 (1994).

Tiitta et al.; *Preparation and Characterization of Phosphorus-Doped Aluminum Oxide Thin Films;* Materials Research Bulletin; 1998; pp. 1315-1323; vol. 33, No. 9.

U.S. Department of Commerce National Technical Information Service; *Ceramic Coatings on Metals Using Atomic Layer Controlled Chemical Vapor Deposition* (Assert-96); Feb. 16, 2000; Colorado University at Boulder.

Utriainen et al.; *Studies of metallic thin film growth in an atomic layer epitaxy reactor using M(ACAC)2 (M=Ni,Cu,Pt) precursors;* Appl. Surf. Sci.; 2000; 151-158; 157(3).

Van Zant, "Microchip Fabrication", 4th Ed., McGraw Hill (New York, NY), pp. 364-365 (2000).

Violette et al., "On the role of chlorine in selective silicon epitaxy by chemical vapor deposition", J. Electrochem. Soc. 143 (10), pp. 3290-3296 (1996).

Wang; *Spin on Dielectric Films—A General Overview;* 1998 5th International Conference on Solid-State and Integrated Circuit Technology Proceedings; Oct. 21-23, 1998; p. 961; Beijing, China.

Windl et al., "Theory of strain and electronic structure of $Si_{1-y}C_y$ and $Si_{1-x-y}Ge_xC_y$ alloys", Phys. Rev. B57 (4), pp. 2431-2442 (1998).

Wise et al.; *Diethyldiethoxysilane as a New Precursor for SiO2 Growth on Silicon;* Mat. Res. Soc. Symp. Proc.; 1994; pp. 37-43; vol. 334.

Wolf et al.; *Process and Equipment Simulation of Copper Chemical Vapor Deposition Using Cu(hfac)vtms;* Microelectronic Engineering; 1999; 15-27; 45.

Yagi et al.; *Substitutional C incorporation into Si1—yCy alloys using novel carbon source, 1,3-disilabutane;* Japanese Journal of Applied Physics; 2004; pp. 4153-4154; vol. 43, No. 7A.

Singapore Written Opinion dated Aug. 8, 2011 for Singapore Application No. 201004102-8.

Agrawal, et al., "Cl Insertion on Si(100)-(2x1): Etching Under Conditions of Supersaturation", Physical Review Letters (2007) 98, 136104-1-136104-4.

Aketagawa, et al., The influence of Cl2 on Si1-xGex selective epitaxial growth and B-doping properties by UHV-CVD'< Journal of Crystal Growth 127 (1993) 484-488.

Aketagawa, et al., "Limitations of selective epitaxial growth conditions in gas-source MBE using $Si_2H_6$", Journal of Crystal Growth 111(1991) 860-863.

Aldao, et al., "Halogen etching of Si via atomic-scale processes", Progress in Surface Science (2001) 68; 189-230.

Aldao, et al., Atomic processes during Cl supersaturation etching of Si(100)-(2x1), Physical Review B (2009) 79: 125303-1-125303-5.

Aoyama, et al., "Si selective epitaxial growth using $Cl_2$ pulsed molecular flow method", Thin Solid Firms 321 (1998) 256-260.

Bauer, et al., "Low temperature Si:C co-flow and hybrid process using $Si_3H_8/Cl_2$", Thin Solid Films 520 (2012) 3133-3138.

Bauer, et al., "Low temperature selective eoitaxial growth of SiCP on Si (110) oriented surfaces", Thin Solid Films 520 (2012) 3144-3148.

Bauer, et al., "Low temperature catalyst enhanced etch process with high etch rate selectivity for amorphous silicon based alloys over single-crystalline silicon based alloys", Thin Solid Films 520 (2012) 3139-3143.

Gao, et al., "Comparison of Cl2 and HCl adsorption on Si(100)-(2x1)", Thin Solid Films (1993) 225: 140-144.

Gao, et al., "Influence of phosphine flow rate on Si growth rate in gas source molecular beam epitaxy", Journal of Crystal Growth 220 (200) 461-465.

Maruno, et al., "Selective Epitaxial Growth by Ultrahigh-Vacuum Chemical Vapor Deposition with Alternating Gas Supply of $Si_2H_6$ and $Cl_2$", Jpn. J. Appl. Phys. 39 (200)) 6139-6142.

Ogryzlo, et al., "The etching of doped polycrystalline silicon by molecular chlorine", J. Appl. Phys. (1988) 64(11) 6510-6514.

Ogryzlo, et al., "Doping and crystallographic effects in Cl-atom etching of silicon", J. Appl. Phys. (1990) 67(6) 3115-3120.

Tatsumi, et al., "Selective epitaxial growth by UHV-CVD using Si2H6 and Cl2", Journal of Crystal Growth 120 (1992) 275-278.

Violette, et al., "Low temperature selective silicon epitaxy by ultra high vacuum rapid thermal chemical vapor deposition using Si2H6, H2 and Cl2", Appl. Phys. Lett. (1996) 68(1) 66-68.

The pending file history for U.S. Appl. No. 13/149,865, filed May 31, 2011.

* cited by examiner

SUBSTRATE REACTOR WITH ADJUSTABLE INJECTORS FOR MIXING GASES WITHIN REACTION CHAMBER

BACKGROUND OF THE INVENTION

1. Field of the Invention

This application relates generally to processing substrates. More particularly, this application relates to the deposition of films onto a substrate and equipment configured for the same.

2. Description of the Related Art

As is well known, substrate processing methods and equipment are often employed for semiconductor processing and for the fabrication of integrated circuits, which entails particularly stringent quality demands, but such processing is also employed in a variety of other fields. For example, semiconductor processing techniques are often employed in the fabrication of flat panel displays using a wide variety of technologies and in the fabrication of microelectromechanical systems (MEMS).

A variety of methods are used in substrate processing to deposit materials onto surfaces. For example, one of the most widely used methods in the semiconductor manufacturing industry is chemical vapor deposition ("CVD"), in which atoms or molecules contained in a vapor deposit on a wafer and build up to form a film. However, existing processes tend to produce films that are non-uniform across the surface of a wafer, resulting in lower quality and yield, and thus, higher costs. Uniformity is often sought by adjusting the parameters of the CVD process, such as by controlling the temperature, pressure, and flow rates of the process gases to and across the surface of the wafer substrate. This adjustment of CVD process parameters is known as "tuning."

In some contexts, it is desirable to deposit selectively within semiconductor windows exposed among fields of different materials, such as field isolation oxide. Selective deposition means that a film, such as silicon, is deposited on a first portion of the surface of the substrate at a greater mean rate than on a second portion of the same surface. Selectivity takes advantage of differential nucleation and/or formation of different crystal morphology during deposition on disparate materials, and typically comprises simultaneous etching and deposition of the material being deposited. The precursor of choice will generally have a tendency to form more rapidly on one surface and less rapidly on another surface. For example, silane will generally nucleate on both silicon oxide and silicon, but there is a longer nucleation phase on silicon oxide. At the beginning of a nucleation stage, discontinuous films on oxide have a high exposed surface area relative to merged, continuous films on silicon. Similarly, the growth on the insulating regions (e.g., silicon oxide) can be amorphous or polycrystalline whereas growth on the semiconductor windows (e.g., silicon) can be epitaxial. Accordingly, an etchant added to the process will have a greater effect upon the poorly nucleating film on the oxide as compared to the more rapidly nucleating film on the silicon. Similarly, an etchant can be more effective against amorphous or polycrystalline growth, whether from a prior deposition or during deposition, than against epitaxial growth. The relative selectivity of a process can thus be improved by tuning the precursor and vapor etchant as discussed above. Typically, a selective deposition process is tuned to produce the highest deposition rate feasible on the window of interest while accomplishing no deposition in the other regions.

Known selective silicon deposition processes include reactants such as silane and hydrochloric acid with a hydrogen carrier gas. Co-owned and co-pending U.S. Patent Application Publication No. U.S. 2006/0234504 A1, entitled "SELECTIVE DEPOSITION OF SILICON-CONTAINING FILMS," teaches processes that employ trisilane as a silicon source and chlorine gas as an etchant. These selective deposition processes show improved uniformity, purity, deposition speed and repeatability. However, strong exothermic reactions have been observed, potentially leading to premature reactant breakdown, damage to the gas intermixing tank, combustion, and substrate contamination. Other selective deposition chemistries are also subject to excessive reactivity.

SUMMARY OF THE INVENTION

One embodiment provides a reactor for processing substrates, comprising a reaction chamber and a substrate support for supporting a substrate inside the reaction chamber. The reactor comprises a first gas delivery path configured to convey a first gas from a first reactant source to a mixing space, and a second gas delivery path configured to convey a second gas from a second reactant source to the mixing space. The reactor comprises a first set of adjustable gas injectors that inject the first gas into the mixing space and control a gas flow profile of the first gas into the mixing space. The reactor further comprises a second set of adjustable gas injectors that inject the second gas into the mixing space and control a gas flow profile of the second gas into the mixing space. The first and second gases mix at the mixing space and form a common flow path from the mixing space to the substrate support. The common flow path has no flow restrictions between the mixing space and the substrate support.

Another embodiment provides a reactor for processing substrates, comprising a reaction chamber defining a reaction space and a substrate support for supporting a substrate inside the reaction chamber. A first gas delivery path is configured to convey a first gas from a first reactant source to the reaction space, and a second gas delivery path is configured to convey a second gas from a second reactant source to the reaction space. A first set of adjustable gas injectors injects the first gas into the reaction space and controls a gas flow profile of the first gas into the reaction space. A second set of adjustable gas injectors injects the second gas into the reaction space and controls a gas flow profile of the second gas into the reaction space, wherein the first and second gases initially mix within the reaction space.

Another embodiment provides an apparatus for selectively forming a semiconductor film on a substrate. The apparatus comprises a chemical vapor deposition (CVD) reactor, a substrate support, first and second inlet sets of one or more inlets, and first and second reactant sources. The CVD reactor comprises a reaction space within which the substrate support supports a substrate. The first and second inlet sets are in fluid communication with the reaction space. The first reactant source is configured to supply a precursor for semiconductor deposition to the first inlet set, and the second reactant source is configured to supply an etchant to the second inlet set. The inlet sets and sources define separate flow paths for the precursor and the etchant to a mixing space within the reaction space, wherein the first and second inlet sets are disposed on the same wall of the mixing space.

Another embodiment provides a method for processing substrates in a reaction chamber. The method comprises providing a substrate within a reaction chamber. A first gas is conveyed from a first reactant source to a mixing space through a first gas delivery path, and a second gas is conveyed from a second reactant source to the mixing space through a second gas delivery path. A first set of injectors is adjusted to inject the first gas into the mixing space and control a gas flow profile of the first gas into the mixing space. Likewise, a second set of injectors is adjusted to inject the second gas into the mixing space and control a gas flow profile of the second gas into the mixing space. The method comprises causing the first and second gases to mix at the mixing space and flow along a common flow path from the mixing space to the substrate, wherein the common flow path has no flow restrictions between the mixing space and the substrate.

Another embodiment provides a method for processing substrates in a reaction chamber. The method comprises conveying a first gas from a first reactant source through a first gas delivery path to a reaction space, and conveying a second gas from a second reactant source through a second gas delivery path to the reaction space. A first set of injectors is adjusted to inject the first gas into the reaction space and control a gas profile of the first gas into the reaction space. Likewise, a second set of injectors is adjusted to inject the second gas into the reaction space and control a gas profile of the second gas into the reaction space. The first and second gases mix within the reaction space.

Another embodiment provides a method for selectively forming a semiconductor film on a substrate. The method comprises providing a chemical vapor deposition (CVD) reactor comprising a reaction space. The substrate is supported within the reaction space with a substrate support. A precursor for semiconductor deposition is conveyed from a first reactant source to a first inlet set of one or more inlets in fluid communication with the reaction space. An etchant is conveyed from a second reactant source to a second inlet set of one or more inlets in fluid communication with the reaction space. The inlet sets and sources define separate flow paths for the precursor and the etchant to a mixing space within the reaction space. The first and second inlet sets are disposed on the same wall of the mixing space.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other aspects of the invention will be readily apparent from the following description and from the appended drawings (not to scale), which are meant to illustrate and not to limit the invention, and in which.

DETAILED DESCRIPTION OF CERTAIN EMBODIMENTS

Figure 1:
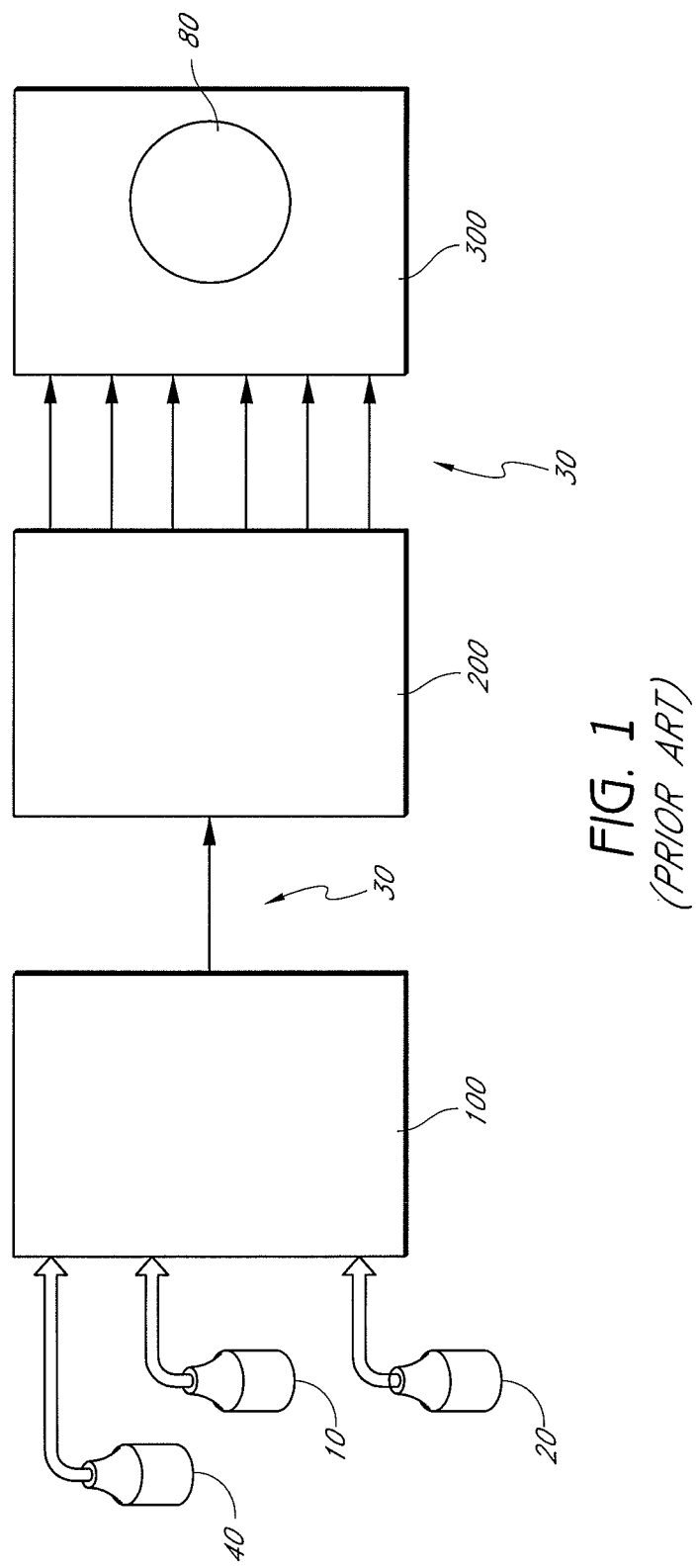
FIG. 1 is a schematic diagram of a conventional system for processing a substrate in a reaction chamber.

Supplying substrate processing equipment that can execute a selective deposition process and still mitigate the reactivity issues described above in the Background section may have an impact on the equipment manufacturer or user. Replacing an entire CVD processing system can be cost prohibitive, and the compatibility of a selective deposition-capable equipment design with an existing system may increase the system's footprint in a semiconductor fabrication facility. An equipment design that provides selective deposition capability must also maximize tuning capability as discussed above while providing accessibility to the equipment for the user.

In many selective deposition processes, Si-containing layers are selectively formed over single crystal semiconductor materials while minimizing and more preferably avoiding deposition over adjacent dielectrics. Examples of dielectric materials include silicon dioxide (including low dielectric constant forms such as carbon-doped or fluorine-doped), silicon nitride, metal oxide and metal silicate. More generally, patterned or mixed substrates have two or more different types of surfaces. There are various ways that the surfaces of a mixed substrate can be different from each other. For example, the surfaces can have different material compositions, different crystal morphologies and/or different electrical properties.

Even if the materials are made from the same composition, surfaces can be different if the morphologies, i.e., the crystallinity of the surfaces, are different. The processes described herein are useful for depositing Si-containing films on a variety of substrates, but are particularly useful for mixed substrates having mixed surface morphologies. A mixed substrate with a mixed surface morphology is a substrate that includes a first surface having a first surface crystal structure and a second, different surface crystal structure. Amorphous, polycrystalline and single crystal are examples of different morphologies.

Epitaxial deposition refers to the deposition of a crystalline semiconductor material onto a crystalline substrate in such a way that the deposited layer adopts or follows the lattice constant of the substrate. Epitaxial deposition may be homoepitaxial or heteroepitaxial. Homoepitaxial deposition occurs when the deposited layer is formed of the same material as that of the substrate, such as epitaxially depositing a layer of silicon on a single-crystal silicon substrate. Heteroepitaxial deposition occurs when the composition of the deposited layer differs from that of the substrate, such as when epitaxially depositing germanium or silicon germanium on a single-crystal silicon substrate.

Epitaxial films are characterized by a crystal structure and orientation that is identical to the substrate upon which they are grown. Typically, the substrate is a single crystal, such that the epitaxial film is also a single crystal. The atoms in these materials are arranged in a consistent lattice-like structure that persists over relatively long distances on an atomic scale. By contrast, amorphous morphology is a non-crystalline structure having a low degree of order because the atoms lack a definite repetitive arrangement. Other morphologies include microcrystalline and mixtures of amorphous and crystalline material. As used herein, a "single-crystal" structure is implied by epitaxial deposition and is used to describe a predominantly large crystal structure that may have a tolerable number of faults therein, as is commonly employed for transistor fabrication. The skilled artisan will appreciate that crystallinity of a layer generally falls along a continuum from amorphous to polycrystalline to single-crystal; the skilled artisan can readily determine when a crystal structure can be considered single-crystal or epitaxial, despite low density faults. The skilled artisan will understand that the methods and apparatuses described herein for depositing Si-containing films onto mixed or patterned substrates having two types of surfaces may also be applied to mixed substrates having three or more different types of surfaces.

FIG. 1 illustrates a conventional system for processing a substrate 80 in a reaction chamber 300. Many aspects of the system shown in FIG. 1 can be used in various embodiments of the present invention. This system can be of many different types, such as a system for deposition of a coating onto an optical substrate. The illustrated system is a chemical vapor deposition (CVD) system for processing semiconductor wafers. The substrate can be either the workpiece upon which deposition is desired, or the surface exposed to reactant gases. For example, the substrate 80 may be a single crystal silicon wafer, or may be a semiconductor-on-insulator (SOI) substrate, or may be an epitaxial Si, SiGe or III-V material previously formed upon such wafers. Wafers include substantially flat and circular substrates, such as those having diameters of 200 mm, 300 mm, and 450 mm. Substrates are not limited to wafers, but also include glass, plastic, or any other substrates employed in a substrate processing system. Process gases, including vapors from a first reactant source 10 and a second reactant source 20, which can be reactants in a CVD process, are supplied to a gas panel 100. Inert gases from an inert gas source 40 can also be added to reactant source 10, 20, or both, to aid in the CVD process. It is conventional to mix the reactive gases 10, 20 upstream of the reaction chamber 300 because a well-mixed, homogenous mixture or feed gas 30 with a uniform concentration of reactants can facilitate uniform deposition on the substrate 80 once the feed gas 30 reaches the reaction chamber 300. Thus, for a single-pass, laminar, horizontal flow single wafer reactor, it is conventional to intermix the reactive gases from the sources 10, 20, 40 at the gas panel 100 to promote uniform deposition on the substrate 80 in the reaction chamber 300. Once the gases from the sources 10, 20, 40 have been intermixed in the gas panel 100, the feed gas 30 is delivered to an inlet distribution manifold 200. The manifold 200 serves to distribute the flow of the feed gas 30 across the width of the reaction chamber 300. The manifold 200 may be configured to distribute flow in such a way to enhance uniformity of the semiconductor deposition on the substrate 80 in the reaction chamber 300. Typically, the delivery of the feed gas 30 from the gas panel 100 to the inlet distribution manifold 200 is accomplished through pipes or tubes with cross-sectional areas that are substantially smaller than that of the gas panel 100. Such pipes or tubes may include valves to regulate the flow of the feed gas 30. Further, within the manifold 200, the feed gas 30 may pass through other piping that restricts the flow of the feed gas 30 into the reaction chamber 300. Thus, the feed gas 30 will typically pass through one or several bottlenecks or flow restrictions within and downstream of the gas panel 100, after the gases from the reactant sources 10, 20 have been intermixed.

The gases from the reactant sources 10, 20 can be used in a selective deposition process. Selective deposition means that a film, such as silicon, is deposited on a first portion of the surface of the substrate 80 at a greater mean rate than on a second portion of the same surface. In some selective deposition embodiments, the rate of semiconductor deposition on the second portion may be approximately the same rate at which silicon is etched away, resulting in an effective deposition rate of zero on the second portion. Cyclical deposition and etching can have the same effect. Selective formation processes using a precursor for semiconductor deposition from the first reactant source 10 and an etchant from the second reactant source 20 show excellent selectivity and deposition speed. Generally, selective deposition processes result in net deposition rates over semiconductor areas being greater than 5 times, and preferably greater than 10 times, rates of deposition over insulators and semiconductor windows. Fully selective processes result in no net deposition over insulators or metals. Net deposition rates are calculated over the entire process, whether simultaneously or sequentially providing precursors and etchants. However, some of these processes have shown strong exothermic reactions when the precursor gas for semiconductor deposition and the etchant gas intermix. Precursors for CVD of semiconductors may comprise, for example, silicon precursors, germanium precursors and carbon precursors. Silicon precursors may include, for example, pentasilane, tetrasilane, trisilane ($Si_3H_8$), dichlorosilane ($H_2SiCl_2$, "DCS"), disilane ($Si_2H_6$), partially chlorinated disilane, methyl silane, silane ($SiH_4$) or 2,2-dichlorotrisilane. Germanium precursors may include, for example, germane, digermane and trigermane. Carbon precursors may include, for example, silylalkanes such as monosilylmethane, disilylmethane, trisilylmethane and tetrasilylmethane, and/or alkylsilanes such as monomethyl silane (MMS), and dimethyl silane. In some embodiments, a carbon precursor comprises $H_3Si\text{---}CH_2\text{---}SiH_2\text{---}CH_3$ (1,3-disilabutane) or $CCl_2(SiH_3)_2$ (2,2-dichlorodisylilmethane). Etchants may include, for example, chlorine gas ($Cl_2$).

Taking trisilane and chlorine gas as an example, it is believed that at high enough partial pressures, $Cl_2$ reacts with Si to produce silicon tetrachloride ($SiCl_4$) in an exothermic reaction. The highly exothermic hypergolic reaction of $Cl_2$ with $Si_3H_8$ can lead to combustion of the silicon precursor. The reaction can occur upstream of the reaction chamber 300 and therefore lead to premature silicon deposition, which can also lead to subsequent spalling or aerosol particle formation and contamination. In addition, the powerful exothermic reactions can damage the equipment at the point of interaction, such as expensive gas panel units 100. Similar issues can arise with other combinations of semiconductor precursors and etchant gases. Without being limited by theory, it is believed that interaction among the reactant gases in a limited volume and/or passing the reactant gases along common or shared flow paths through flow restrictions prior to entry into the reaction chamber 300 may contribute to these problems. Interaction between highly reactive precursors and etchants under the high pressures caused by these restrictions in a very confined flow path might cause the highly energetic reactions that have been observed. Damage is greater in confined passages, and may exacerbate reactivity by inhibiting heat dissipation, relative to wider, more voluminous spaces. Note that such interaction can occur within these tight confines whether the reactants are supplied simultaneously or sequentially. In sequential supply, residual reactants from a first pulse inevitably remain within the shared flow path when the next pulsed is supplied, which can then react in the shared flow path upstream of the chamber.

Embodiments taught herein avoid undesired effects of highly reactive combinations of a semiconductor precursor and an etchant species in selective formation processes by separately injecting the reactive species into the reaction chamber 300. Particularly volatile combinations of precursor and etchant produce reactions that are at least as exothermic as the reaction of DCS+$Cl_2$. Several highly reactive combinations include without limitation pentasilane+$Cl_2$; tetrasilane+$Cl_2$; trisilane+$Cl_2$; disilane+$Cl_2$; a partially chlorinated disilane+$Cl_2$. The table below compares exothermicity, in terms of approximate enthalpy values, for certain silicon precursors when combined with $Cl_2$.

| Silicon Precursor | Enthalpy at 0° C. (kcal/mol) | Enthalpy at 550° C. (kcal/mol) |
|---|---|---|
| Trisilane | −450 | −550 |
| Silane | −500 | −500 |
| Disilane | −460 | −460 |
| Monochlorodisilane | −400 | −380 |
| Dichlorodisilane | −340 | −320 |
| Trichlorodisilane | −270 | −250 |
| Dichlorosilane | −270 | −250 |
| Tetrachlorodisilane | −220 | −200 |
| Pentachlorodisilane | −150 | −130 |

While much of the description herein focuses on the exemplary combination of trisilane+$Cl_2$, the skilled artisan will readily appreciate from the disclosure herein that the described equipment will also benefit process recipes employing other highly reactive combinations, particularly those more exothermic than DCS+$Cl_2$, at the reaction temperature (e.g., more exothermic than −270 kcal/mol at 0° C. or −250 kcal/mol at 550° C.).

Exemplary processes in which selective formation of semiconductor films is accomplished by supplying deposition precursors and etchants sequentially, rather than simultaneously, are disclosed in U.S. Patent Application Publication No. 2007/0287272, published Dec. 13, 2007 (the '272 publication), the entirety of which is incorporated herein by reference. The sequential and preferably cyclical process of the '272 publication provides for blanket deposition over insulating and single-crystal silicon surfaces of a patterned or mixed substrate, followed by selective etching of non-epitaxial material. The blanket deposition is conducted in the absence of etchant, or with low enough levels of etchant as to result in significant net deposition on all surfaces. Epitaxial semiconductor material is left on single crystal semiconductor windows of the patterned substrate, while nonepitaxial material is left on other surfaces, such as metals on insulators. Nonepitaxial (e.g., amorphous or polycrystalline) semiconductor material is more susceptible to etching, and the subsequent etchant pulse is timed to remove all non-epitaxial material from the deposition while leaving at least some of the epitaxial material from the deposition.

Processes and equipment for processing substrates have now been discovered that minimize risk of violent reaction between reactant sources. The described processes and equipment supply the reactants to the reaction chamber using separate gas delivery paths rather than a common flow path upstream of the reaction chamber. Without limiting the invention by theory, it is believed that embodiments of the present invention minimize the risk of premature reactant breakdown, combustion, damage to equipment and substrate contamination by providing adjustable separate flow paths for process gases, thereby avoiding their interaction under high pressure in a limited volume at the gas panel 100 (FIG. 1) or between the gas panel 100 and the reaction chamber 300. Moreover, the reactivity of the gases can be further minimized by adjusting the amount of carrier gas, shortening the residence time of the gases, increasing the velocity of the gases and/or improving the heat capacity of the gases. The injection and flow profile of the reactants from each separate gas delivery path into the chamber can be controlled by a separate set of adjustable gas injectors. Because the gases avoid interaction in high pressure regions that could trigger or exacerbate upstream reactions, intermediate reactive species (e.g., SiHCl, $SiH_2$ and $Si_2H_4$ for $Si_3H_8$+$Cl_2$ reactants) can reach the substrate 80 rather than having the reaction completed prematurely. These processes and equipment avoid undesired heat formation and premature deposition, and reduce the risk of damage to expensive gas panel units. Embodiments of the present invention also provide increased control of the reactants across the substrate to provide improved deposited film quality.

Some embodiments of the present invention can be used to separate precursors used in forming transistor structures, such as NMOS structures. For example, the present invention can be used when forming an n-doped silicon layer using trisilane, or a combination of trisilane and monomethyl silane, and an n-dopant such as $PH_3$. Deposition can be followed by a cleaning process, using, for example, HCL and $Cl_2$. Some of these embodiments are discussed further herein.

Figure 2:
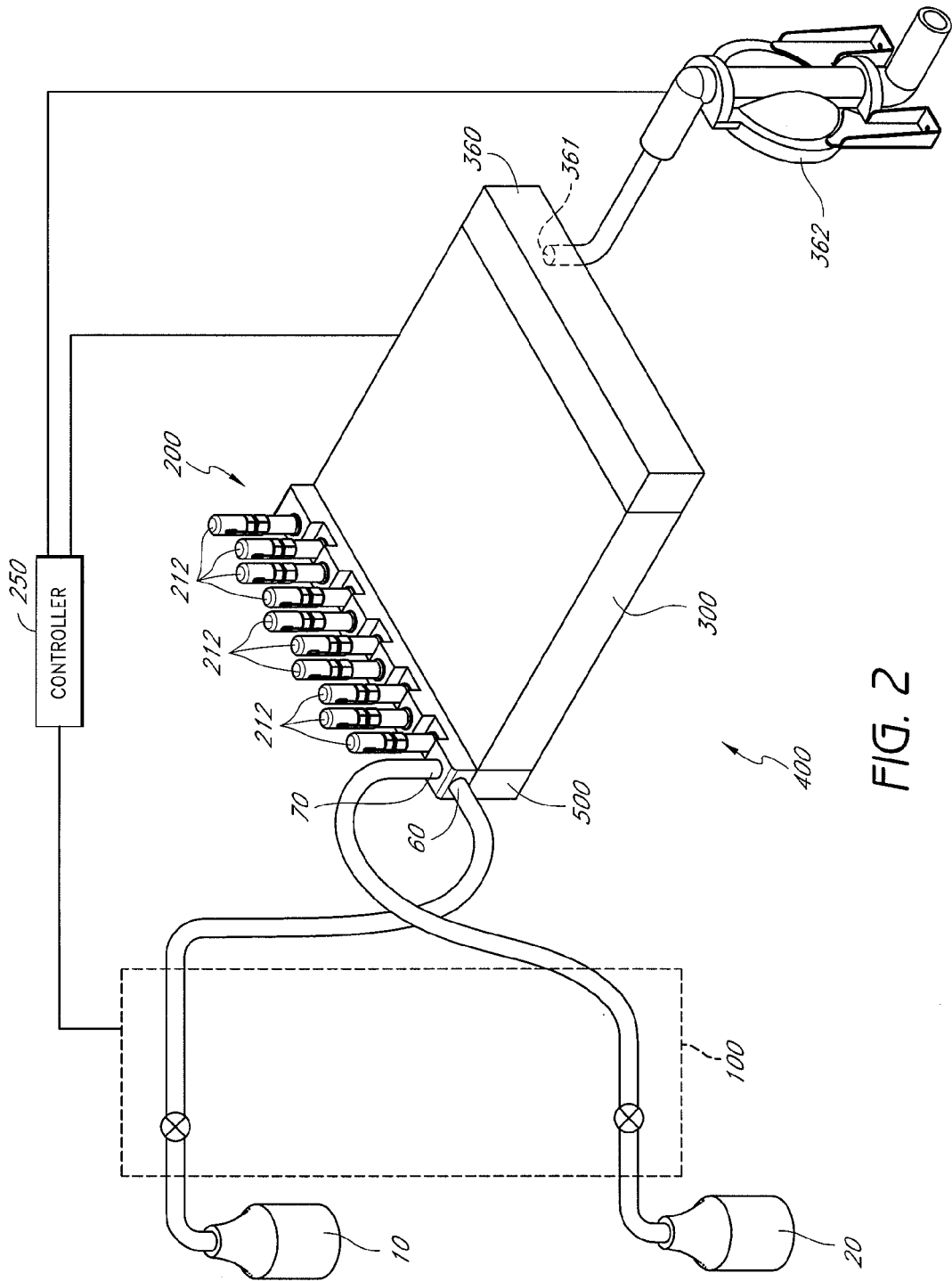
FIG. 2 is a schematic diagram of a system for processing substrates in accordance with an embodiment.

FIG. 2 is a schematic view of a system for processing substrates in accordance with an embodiment of the present invention. In an embodiment, the substrates 80 (not shown) are processed in a reactor 400. Reactor 400 comprises reaction chamber 300 in which the substrates are processed, and an upstream manifold 200 through which process gases and the substrates are supplied to the reaction chamber 300. Reaction chamber 300 can be a chamber for processing semiconductor wafers, such as a single wafer chamber, particularly a vertical or horizontal gas flow CVD chamber. In some embodiments, the reaction chamber 300 is a cold wall, radiantly heated, single-wafer, single pass, laminar horizontal gas flow chamber. Suitable reactors of this type are commercially available, including the Epsilon™ series of single-wafer reactors commercially available from ASM America, Inc. of Phoenix, Ariz. The reaction chamber 300 of the illustrated embodiment preferably includes a rotating substrate 80 (see FIG. 3), and permits low process gas residence times. CVD may be conducted by introducing plasma products to the chamber, either in situ or downstream of a remote plasma generator. Alternatively, thermal CVD can be used.

In the embodiment shown in FIG. 2, the first reactant source 10 and second reactant source 20 are in fluid communication with the gas panel 100. The gas panel 100 may include valves, mass flow controllers (MFCs), and other control elements (not shown) that allow the operator to balance various parameters to optimize deposition in the reaction chamber 300. Such parameters include, but are not limited to, flow rates, temperatures, and total pressures for vapors from the first reactant source 10, and second reactant source 20. The first and second reactant sources 10, 20 can be chosen to promote selective deposition of semiconductor films on the substrate 80, as described above. In an embodiment, the first and second sources 10, 20 are a precursor for vapor deposition and a vapor etchant.

Precursors for CVD of semiconductors may comprise, for example, silicon precursors, germanium precursors and carbon precursors. In an embodiment, first reactant source 10 is a silicon precursor. Silicon precursors may include silanes such as, for example, pentasilane, tetrasilane, trisilane ($Si_3H_8$), dichlorosilane ($H_2SiCl_2$, "DCS"), disilane ($Si_2H_6$), partially chlorinated disilane, methylsilane, monosilane ($SiH_4$), or 2,2-dichlorotrisilane. As used herein, the term "silane" encompasses chlorinated silanes, non-chlorinated silanes, and organic silanes. Non-chlorinated silanes include those having a formula $Si_nH_{2n+2}$, including monosilane ($SiH_4$), disilane ($Si_2H_6$), and trisilane ($Si_3H_8$). Some chlorinated silanes are dichlorosilane ("DCS") and trichlorosilane ("TCS"). An example of an organic silane is trimethylsilane. In other embodiments, first reactant source 10 is a germanium precursor. Germanium precursors may include, for example, germane, digermane and trigermane. In another embodiment, first reactant source 10 is a carbon precursor. Carbon precursors may include, for example, silylalkanes such as monosilylmethane, disilylmethane, trisilylmethane and tetrasilylmethane, and/or alkylsilanes such as monomethyl silane (MMS), and dimethyl silane. In some embodiments, a carbon precursor comprises $H_3Si$—$CH_2$—$SiH_2$—$CH_3$ (1,3-disilabutane) or $CCl_2(SiH_3)_2$ (2,2-dichlorodisyilmethane).

Embodiments can employ a chlorine-containing species, such as diatomic chlorine gas ($Cl_2$), in the second reactant source 20. Employing diatomic chlorine as an etchant can provide superior etch capability even at low temperatures in the range of 400° C. and 600° C., but can be highly reactive in combination with precursors for semiconductor deposition. In another embodiment, the second reactant source 20 may comprise an etchant comprising hydrogen chloride (HCl). HCl is a very corrosive gas, and it retains moisture. The corrosivity and moisture retention properties inherent to a HCl etchant can be detrimental to other gases and equipment with which it contacts. As such, embodiments of the present invention are useful in isolating the HCl etchant and preventing it from contaminating other gases and other equipment until it mixes in the reaction space, as discussed further below. In one embodiment, the precursor comprises trisilane ($Si_3H_8$) and the etchant comprises diatomic chlorine ($Cl_2$). In another embodiment, the precursor comprises a silane, and the etchant comprises HCl. In another embodiment, the precursor comprises monosilane ($SiH_4$) and the etchant comprises hydrogen chloride. The first reactant source 10 can also represent multiple reactant vessels, such as for deposition of SiGe, Si:C or SiGe:C. The second reactant source 20 can contain a halogen-containing etchant to provide selectivity to the deposition process. As noted above, processes taught herein provide particular advantages when the combination of the first reactant source 10 and the second reactant source 20 is a highly reactive combination that produces exothermic reactions.

Note that more than two reactant sources 10, 20 can be used, but only two are shown in FIG. 2 for simplicity. Thus, either or both reactant sources 10, 20 can comprise or be mixed with an inert gas source 40, such as that discussed above and shown in FIG. 1. If an inert gas source is used, it may also communicate with gas panel 100 as a purge gas and/or carrier gas for either the first reactant source 10 or the second reactant source 20. Among other roles, the inert gas source can provide backpressure for the gases at their inlets to the chamber 300, thus preventing gas from the first reactant source 10 from diffusing upstream into the gas delivery path of the second reactant source, and vice versa, whether for simultaneous or sequential supply of precursors and etchants, discussed further below. The inert gas source 40 can also remove heat due to its heat capacity, thereby lowering the temperature of the reactants. Further, the inert gas source can dilute vapors from the first and second reactant sources 10, 20 (i.e., reduce the concentration of the reactant gases delivered to the reaction chamber 300), thereby slowing the reaction and aiding stable, slow decomposition of the precursors where desired. This, in turn, yields favorable precursor utilization and high growth rates for the film, as well as a lower temperature in the reaction chamber 300. In order to minimize exothermic reactions, in some embodiments the inert gas source includes helium (He), argon (Ar), nitrogen ($N_2$), xenon (Xe), krypton (Kr), neon (Ne) or other gases that are nonreactive under deposition conditions. The carrier gas may further include inhibitors such as those disclosed in co-owned and co-pending U.S. patent application Ser. No. 11/925,518, entitled "INHIBITORS FOR SELECTIVE DEPOSITION OF SILICON CONTAINING FILMS," which is hereby incorporated by reference in its entirety, and in particular for its description of suitable inhibitor agents for decelerating reactions between silicon precursors and chlorine-containing etchants. Examples include propylene, butadiene, benzene, naphthalene, phenanthrene, anthracene, cycloheptatrienecation, cyclohelptatrien, furan, pyridine, pyrrole and thiophene. Because of the ability of the inert gas source to dilute and lower the temperature of the first and second reactant sources 10, 20 and thus inhibit the reaction, relatively higher flow rates of gas from the inert gas source may be supplied for relatively more reactive combinations of the first and second reactant sources 10, 20. For example, in embodiments employing trisilane and chlorine gas, which is a very highly reactive combination, the gas from inert gas source may have a flow rate between about 10 and 40 slm.

In some embodiments, it is desirable to prevent interaction of the vapor phase gases from the first reactant source 10 and the second reactant source 20 in the gas panel 100. Referring still to FIG. 2, gases or vapors from the reactant sources 10, 20 communicate with the reaction chamber 300 by way of an injector housing 500 included with manifold 200. In particular, a first gas conveyed from the first reactant source 10 and through gas panel 100, flows to a supply line 60 of the injector housing 500, while a second gas conveyed from the second reactant source 20 and through gas panel 100 flows separately to a supply line 70 of the injector housing 500. A skilled artisan will recognize that supply lines 60, 70 can be configured in many different ways. For example, in some embodiments, supply lines 60, 70 may comprise more than one port in communication with first channels 211a, 211b (FIG. 6), respectively, to provide better distribution of first reactant source 10, 20 thereto. Additionally, supply lines 60, 70 can extend horizontally or vertically away from an upper or lower portion of housing 500 (FIGS. 2, 9), or any combination thereof. The injector housing 500 may be configured to convey gases across the width of a reaction space 340 (FIG. 3) defined in part by the reaction chamber 300, as discussed further below. An exhaust flange 360 on a downstream end of the reaction chamber 300 comprises an exhaust outlet 361, which is configured to evacuate excess gas vapors and reaction by-product from the reaction space 340. This process may be effectuated by means of a pump 362 communicating with the exhaust outlet 361.

Figure 3:
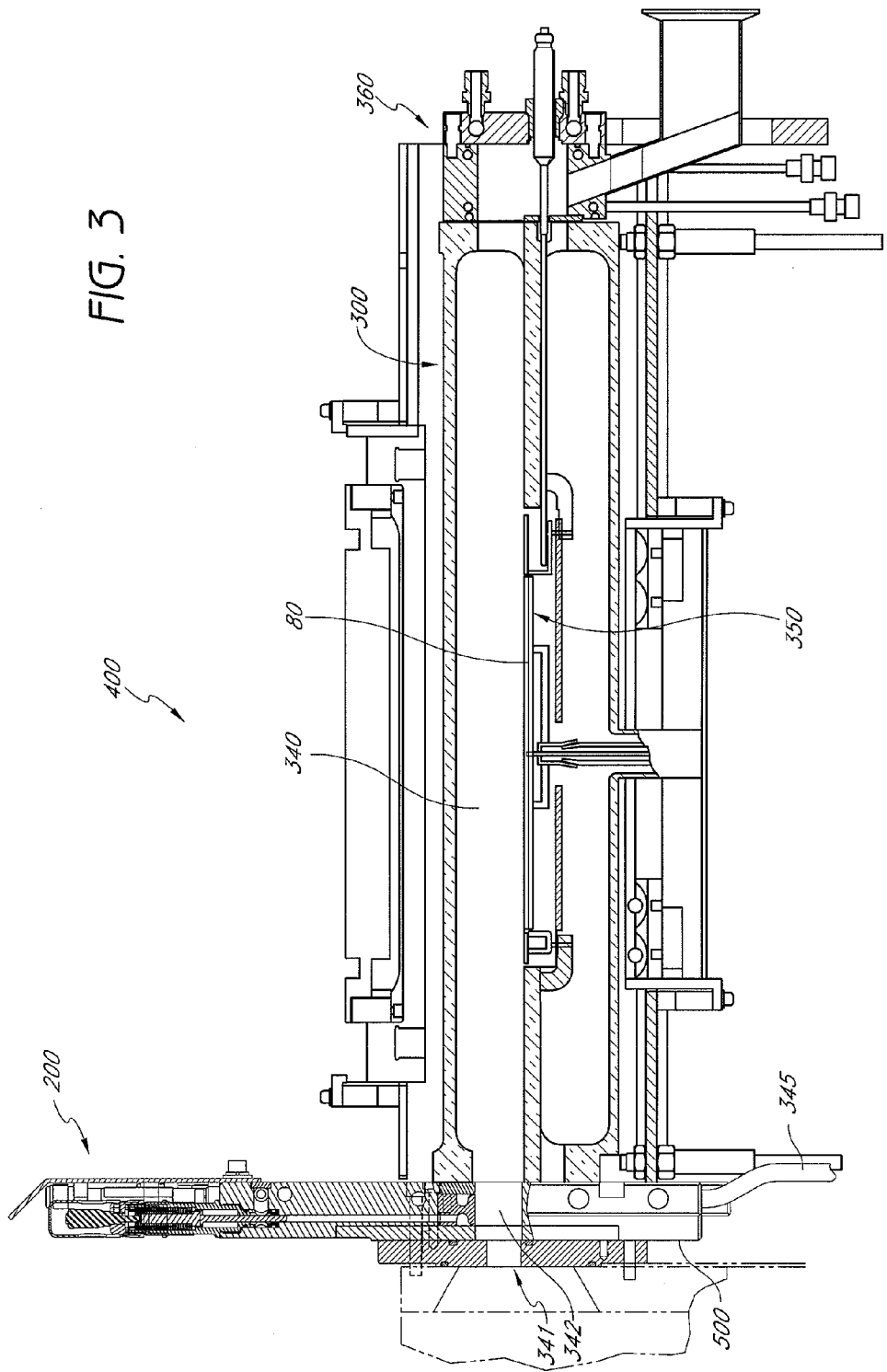
FIG. 3 is a cross-sectional side view of a reactor in accordance with an embodiment.
Figure 4:
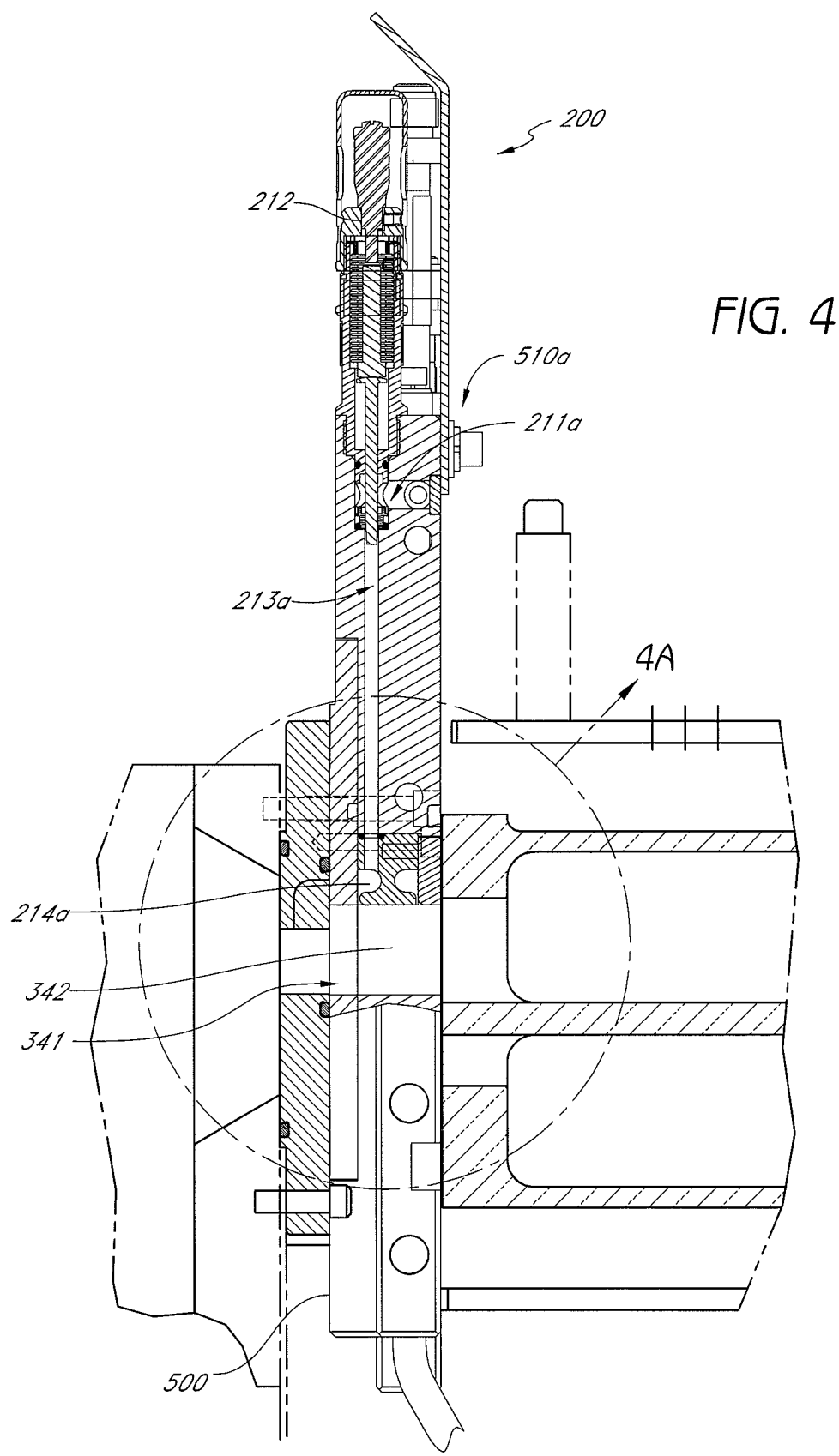
FIG. 4 is a cross-sectional side view of an injector housing shown in FIG. 3.
Figure 5:
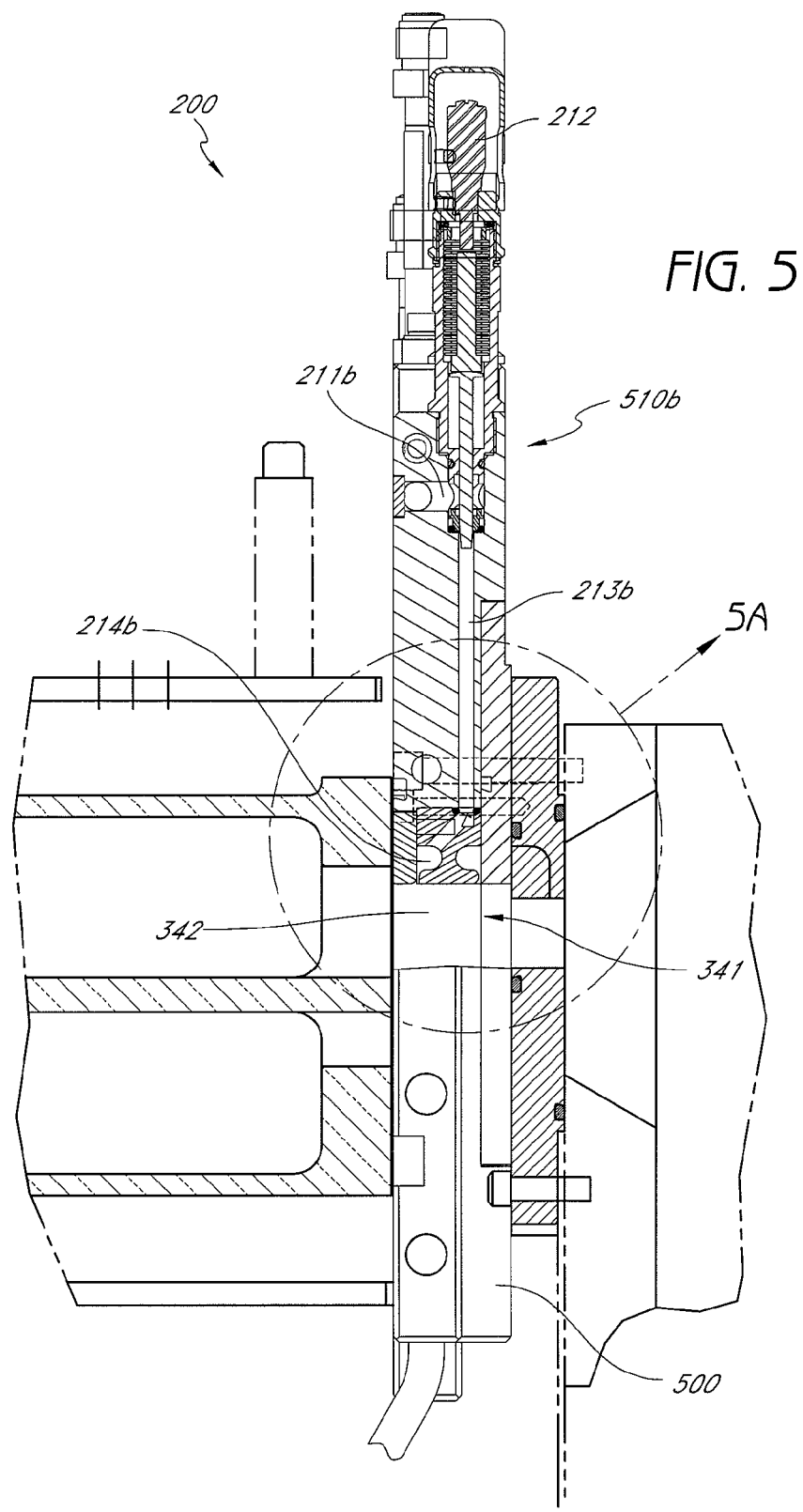
FIG. 5 is a cross-sectional reverse side view of the injector housing shown in FIG. 4.
Figure 6:
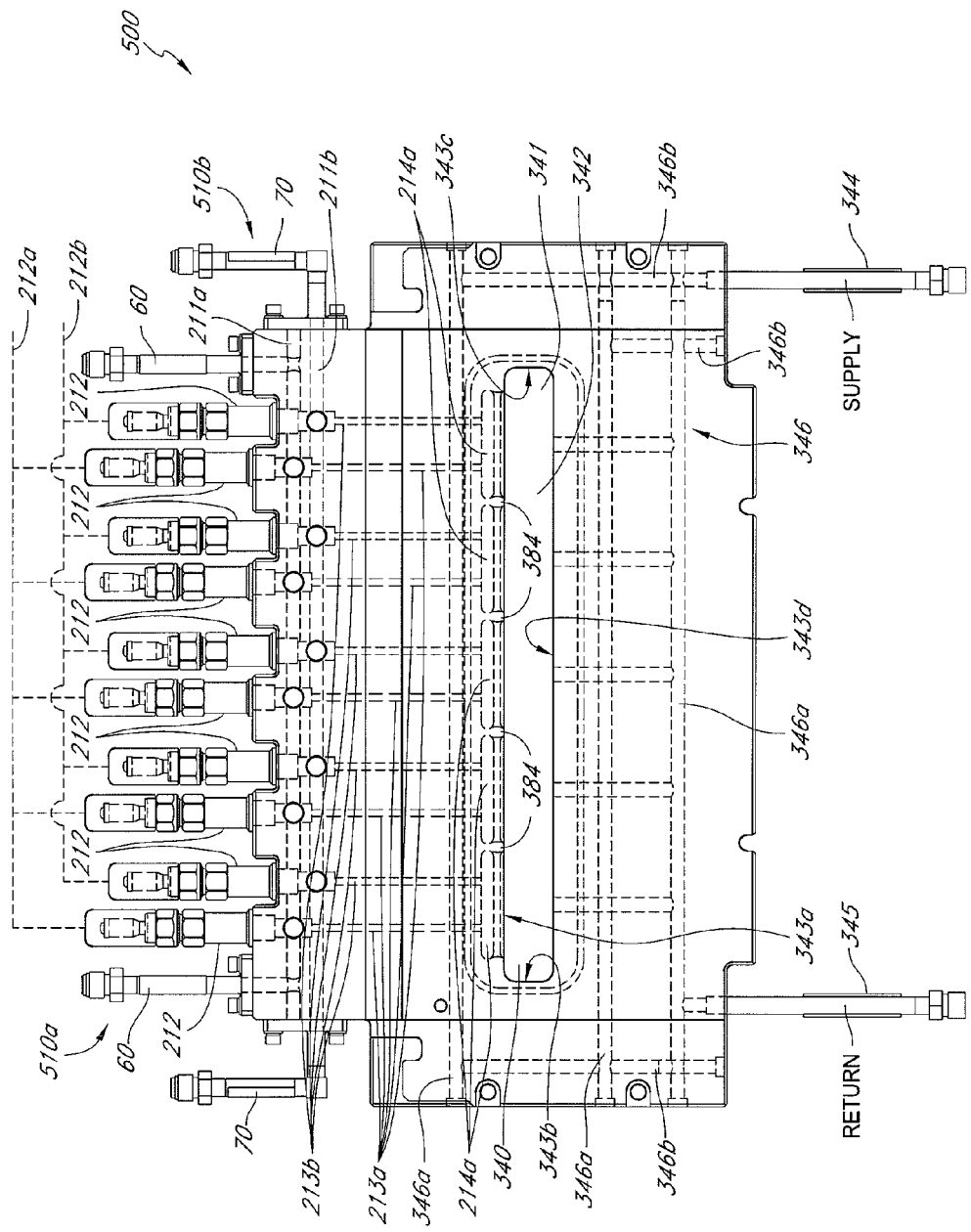
FIG. 6 is a cross-sectional front view of the injector housing shown in FIGS. 2 and 3 in accordance with an embodiment.

FIG. 3 is a schematic cross-section illustrating the reaction space 340. The reaction space 340, as described herein, includes the space defined by the walls (e.g., quartz walls) of the reaction chamber 300 in addition to the space defined by an upstream wafer insertion channel 341 of the injector housing 500. Channel 341 can have any of many different shapes and sizes. In this embodiment, channel 341 is bounded by four walls 343a-343d with openings 343e and 343f at their opposed ends (FIGS. 4-6). Channel 341 can be sized and shaped to pass substrate 80 through it for loading and unloading. The first and second gases from reactant sources 10, 20 are kept separate through the first and second supply lines 60, 70 (FIG. 2) and through separate first and second gas delivery paths extending through injector housing 500.

Figure 4A:
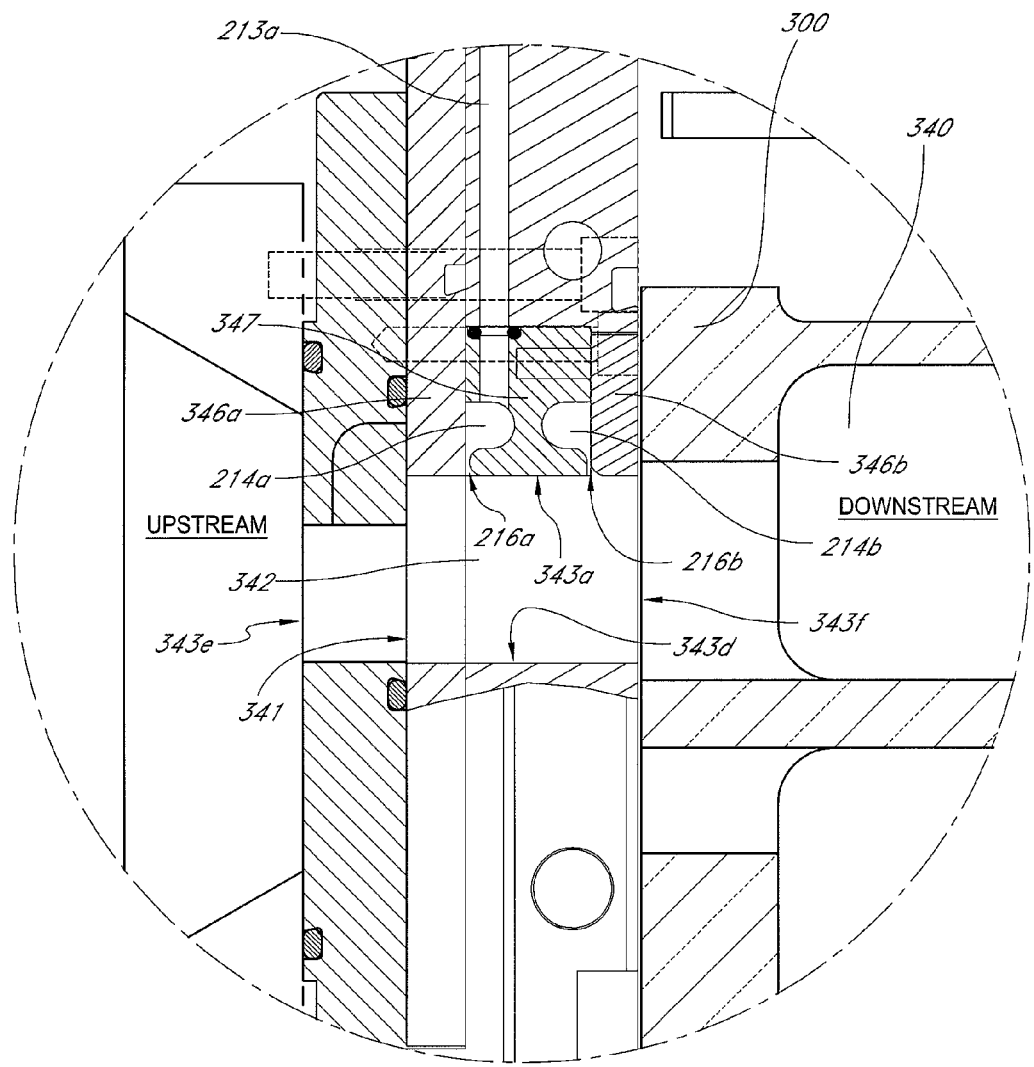
FIG. 4A is an enlarged view of the injector housing shown in FIG. 4.

FIGS. 4, 4A and 6 are a cross-sectional side view, an enlarged cross-sectional side view, and a cross sectional front view, respectively, that illustrate an embodiment of a first gas delivery path 510a extending through housing 500. The first gas delivery path 510a can be configured in many different ways. In the illustrated embodiment, first gas delivery path 510a comprises a first (horizontal in this embodiment) channel 211a extending through housing 500 and in fluid communication with first supply line 60 (FIGS. 4, 6). A first (vertical in this embodiment) entrance path or conduit 213a is in communication with first channel 211a and extends between channel 211a and a first horizontal channel 214a, which traverses a portion of the width of reaction space 340. First horizontal channel 214a is in fluid communication with reaction space 340 via a first inlet. The first inlet to reaction space 340 can be many different shapes and sizes, such as a round orifice. In an embodiment, the first inlet and surrounding structure is shaped and sized so that the first gas is injected into reaction space 340. In this embodiment, the first inlet is a first slit 216a that extends across the width of channel 214a (FIG. 4A). In this way, first gas delivery path 510a is configured to convey a first gas from the first reactant source 10 to the reaction space 340.

In the illustrated embodiment, as best shown in FIGS. 4A and 6, the housing 500 includes a plurality of vertical entrance paths 213a extending from the channel 211a, each path 213a having a corresponding horizontal channel 214a and slit 216a at an end thereof. The channels 214a are preferably aligned so as to convey a plurality of aligned jets of gas into the reaction space 340. As described further below, the use of multiple conduits 213a and channels 214a facilitates the control of a flow profile of the first gas into the reaction chamber 300.

It may be desirable to control or adjust the gas flow from first reactant source 10 into reaction space 340, and to control or adjust a flow profile of gas from first reactant source 10 across the width of reaction space 340, to provide improved uniformity in thickness and chemical composition for the deposited film on substrate 80. The gas flow from first reactant source 10 can be controlled in many different ways, such as with an MFC positioned on the gas panel 100 as discussed above. In an embodiment shown in FIGS. 2-6, the flow of the first gas from reactant source 10 is controlled with an adjustable gas injector 212 configured on housing 500. The adjustable gas injector 212 can be adjusted in many different ways, such as manually or with a computer control system, such as controller 250 (FIG. 2) discussed further below. The adjustable gas injector 212 can be configured on housing 500 in many different ways. In this embodiment, gas injector 212 is configured to be at least partially contained by housing 500, and is configured to control the flow of the first gas from first channel 211a into first entrance path 213a.

The flow profile of gas from first reactant source 10 across the width of reaction space 340 can be controlled with a first set of adjustable gas injectors 212a extending across the width of housing 500 and corresponding to a first set of entrance paths 213a, horizontal channels 214a, and slits 216a, spanning some, most, or all of the width of reaction space 340. In an embodiment of the substrate processing system shown in FIGS. 2-6, these components are shown in a set of five, although many different quantities can be used.

In operation, the first gas from the first reactant source 10 is conveyed into injector housing 500 through first supply line 60, and enters first gas delivery path 510a via first channel 211a. The first gas is conveyed from first channel 211a through the first set of adjustable gas injectors 212a. Each adjustable gas injector 212 in the first set of adjustable gas injectors 212a is adjusted relative to each other to control the flow of gas from the first channel 211a into each associated entrance path 213a. Next, the first gas is conveyed from each first entrance path 213a into each first horizontal channel 214a. From each first horizontal channel 214a, the first gas flows into the reaction space 340 via each first slit 216a. The first slit 216a can have a smaller cross-sectional area, transverse to the gas flow path, than the channel 214a and can therefore be a bottleneck or flow constriction on gases from the first reactant source 10, aiding in distributing the gases across the portion of the width of the reaction space 340 that the slit 216a traverses. In this way, the first set of adjustable gas injectors 212a injects the first gas into the reaction space 340. FIGS. 3-5 illustrate one embodiment of manifold 200, but other configurations can alternatively be employed to control the gas flow profile of the first gas across the width of the reaction chamber 300. For example, gas from the first reactant source 10 may flow into the reaction space 340 directly from a single channel or from a single slit that traverses all or a substantial portion of the width of the reaction space 340, rather than from multiple slits 216a as shown. Thus, manifold 200 can define multiple inlets to the reaction space 340, as shown, or a single inlet.

Figure 5A:
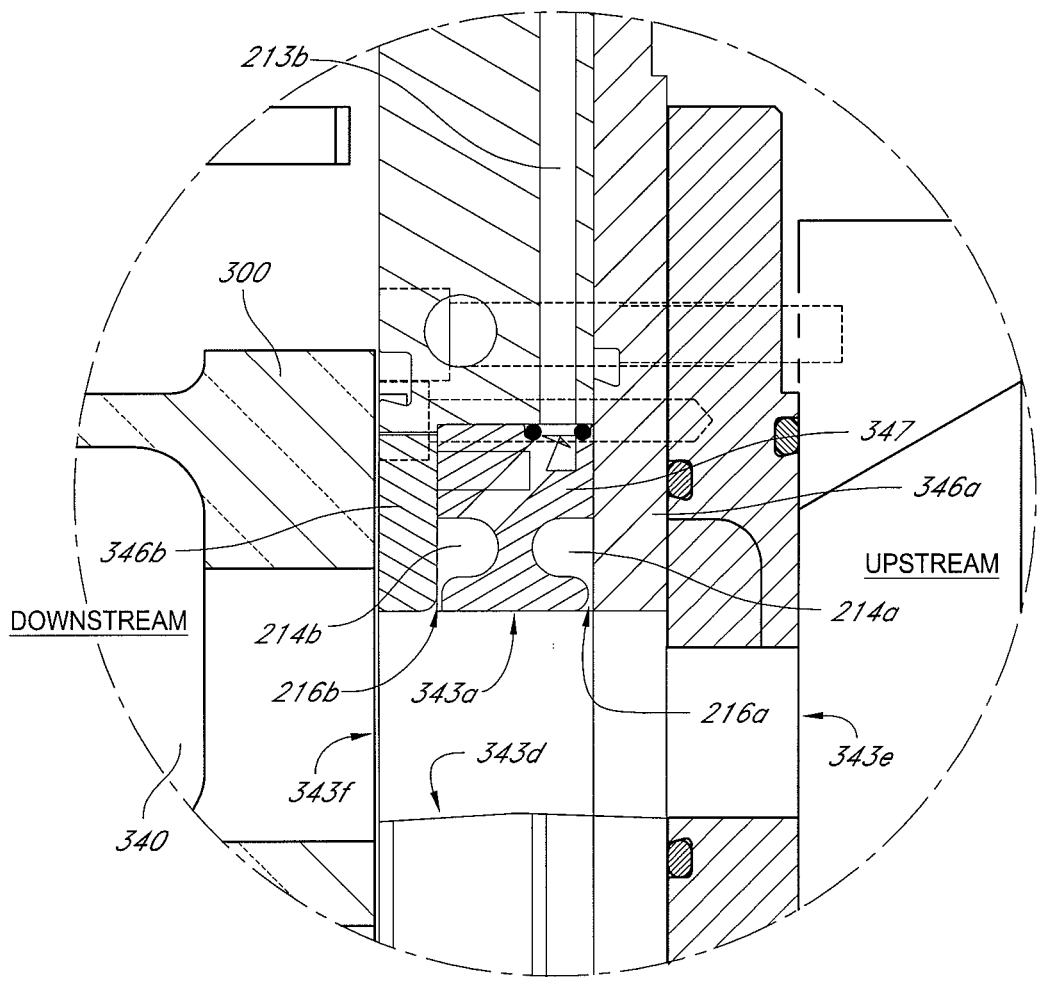
FIG. 5A is an enlarged view of the injector housing shown in FIG. 5.

FIGS. 5, 5A and 6 are a cross-sectional side view, an enlarged cross-sectional side view, and a cross sectional front view, respectively, that illustrate an embodiment of a second gas delivery path 510b extending through housing 500. The second gas delivery path 510b comprises a second (horizontal in this embodiment) channel 211b extending through housing 500 and in fluid communication with second supply line 70 (FIGS. 5A, 6). A second (vertical in this embodiment) entrance path 213b is in communication with second channel 211b and extends between the channel 211b and a second horizontal channel 214b, which traverses a portion of the width of reaction space 340. Second horizontal channel 214b is in fluid communication with reaction space 340 via a second inlet, which in the illustrated embodiment comprises a second slit 216b (FIG. 5A). As such, second gas delivery path 510b is configured to convey a second gas from the second reactant source 20 to the reaction space 340. A skilled artisan will recognize that any of the variations discussed above for first supply line 60 and first gas delivery path 510a will similarly apply to second supply line 70 and second gas delivery path 510b. In the illustrated embodiment, each channel 214b and slit 216b are aligned (with respect to the width of chamber 300) with a corresponding channel 214a and slit 216a, however that need not be the case.

In operation, the second gas is conveyed from the second reactant source 20 through the second gas delivery path 510b and into reaction space 340 similarly to the manner discussed above for first gas delivery path 510a, with first supply line 60, first channel 211a, first entrance paths 213a, first horizontal channels 214a and first slits 216a functioning similarly to second supply line 70, second channel 211b, second entrance paths 213b, second horizontal channels 214b and second slits 216b, respectively. A second set of adjustable gas injectors 212b injects the second gas into the reaction space 340 and controls the gas flow and flow profile of the second gas from second reactant source 20 into the reaction space 340 similarly to the first set of gas injectors 212a for the first gas. The second set of adjustable gas injectors 212b can be configured to be at least partially contained by the housing 500, similar to the first set of gas injectors 212a. The alternative features and functions discussed above for the first gas delivery path 510a and its components can be similarly employed with second gas delivery path 510b and its components.

In the embodiment shown in FIGS. 3-6, first supply line 60, first channel 211a, first entrance paths 213a, first horizontal channels 214a and first slits 216a are separate from second supply line 70, second channel 211b, second entrance paths 213b, second horizontal channels 214b and second slits 216b. As such, the first gas from the first reactant source 10 and the second gas from the second reactant source 20 mix or interact for the first time at a mixing space 342 within the wafer insertion channel 341. The mixing space 342 thus represents the first intersection between first gas flow path 510a and second gas flow path 510b. As such, the first gas flow path 510a and second gas flow path 510b define separate flow paths for the first and second gases to the mixing space 342 within reaction space 340.

Slits 216a, 216b can be configured in many different ways. Referring again to an embodiment illustrated in FIGS. 4A and 5A, housing 500 includes a front portion 346a and a rear portion 346b. Front portion 346a is positioned at an upstream side of housing 500, and rear portion 346b is positioned at a downstream side of housing 500. The upstream and downstream sides of housing 500 are defined by the flow of gases from housing 500 through reactor chamber 300 and exhaust flange 360. As such, the upstream side of housing 500 faces away from reactor chamber 300 and the downstream side of housing 500 faces towards reactor chamber 300. A diverter 347 can be positioned between portions 346a, 346b and partially defines an upper wall 343a of channel 341. In the illustrated embodiment, diverter 347 is shaped and sized such that channels 214a, 214b and slits 216a, 216b are located between the diverter 347 and portions 346a, 346b respectively, and such that entrance paths 213a, 213b extend therethrough. In this embodiment, first channel 214a and first slit 216a are located between diverter 347 and front portion 346a, and second channel 214b and second slit 216b are located between diverter 347 and rear portion 346b. Thus, each corresponding first slit 216a, channel 214a, second slit 216b, and channel 214b can be substantially parallel to each other. As such, first slit 216a and channel 214a are positioned forward, or upstream, of second slit 216b and channel 214b, and second slit 216b and channel 214b are positioned aft, or downstream, of first slit 216a and channel 214a. Thus, first slit 216a injects the first gas upstream of second slit 216b into mixing space 342 and second slit 216b injects the second gas downstream of first slit 216a into mixing space 342.

With reference to FIG. 6, the diverter 347 can have a plurality of dividers or vanes 384 positioned at intervals along its width. In this context, "width" refers to the horizontal dimension transverse to the direction of gas flow across the substrate. Vanes 384 extend through diverter 347 so that gases in channels 214a (and channels 214b) are not in fluid communication with each other until they flow past slits 216a (and 216b). Vanes 384 can be positioned in many different ways along the width of diverter 347. For example, vanes 384 can be positioned so that the slits 216a, 216b and channels 214a, 214b vary in width. In this embodiment, vanes 384 are positioned so that the five illustrated slots 216a, 216b, and corresponding channels 214a, 214b have substantially the same width. It may be desirable to increase the collective span of slits 214a, 214b across the channel 341 and mixing space 342 while still allowing slits 216a and 216b to separately inject the first and second gases into mixing space 342 and channel 341. This increases the uniformity of the gas flow distribution of the first and second gases across mixing space 342, and thus substrate 80. It should be noted that diverter 347 and portions 346a, 346b are shown as separate pieces, although in some embodiments they can be a single integrated piece.

Figure 6A:
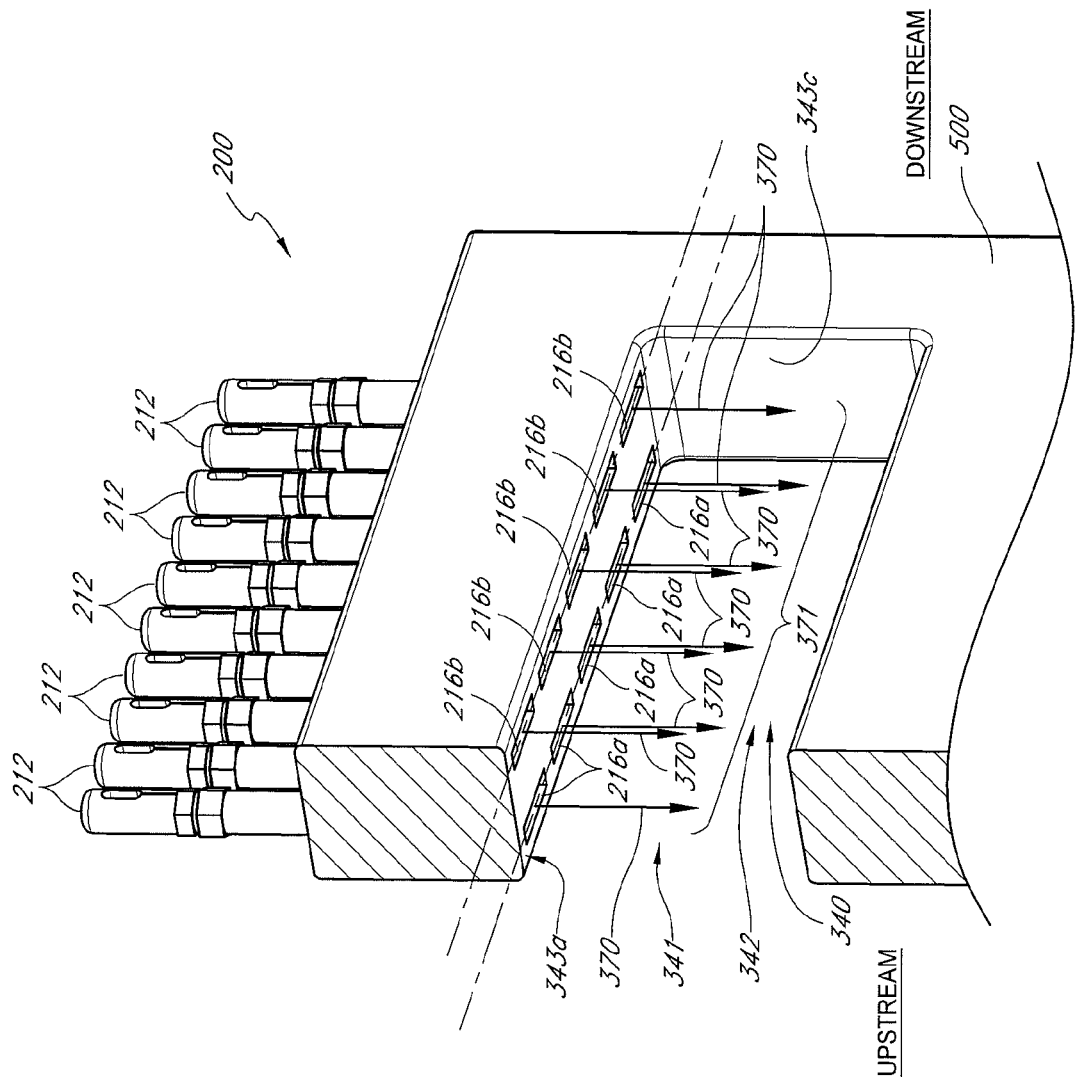
FIGS. 6A and 6B are isometric views of an injector housing showing a gas curtain comprising a plurality of gas jets in accordance with two embodiments.

In an embodiment shown in FIG. 6A, slits 216a are aligned across the width of reaction space 340, and slits 216b are separately aligned across the width of reaction space 340. As such, the two sets of slits are substantially parallel to each other, with the alignment of slits 216a being upstream of the alignment of slits 216b as discussed above. In this embodiment, each of the adjustable gas injectors 212 is configured to inject one of the first and second gases into reaction space 340 as a gas jet 370 emitted from one of the inlets, or slits 216a, 216b. The flow rate of each gas jet 370 can be adjusted relative to the other gas jets 370 by adjusting its corresponding gas injector 212 relative to the other gas injectors 212. In this way, a pair of gas curtains 371, each comprising the plurality of gas jets 370 from one of the corresponding sets of slits 216a, 216b, is injected into and across the width of reaction space 340, wherein a first gas curtain is injected upstream of the second gas curtain.

Figure 6B:
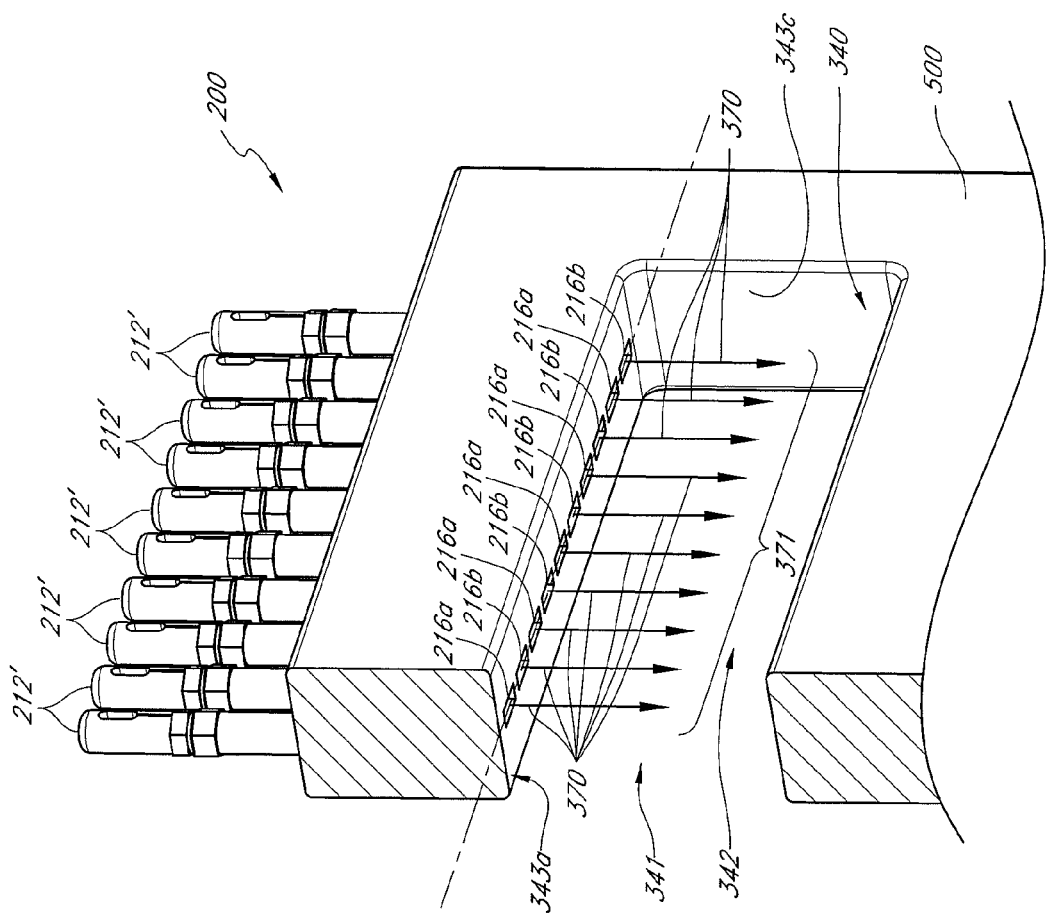

FIG. 6B shows another embodiment of the sets of slits 216a, 216b. In FIG. 6B, slits 216a and 216b are aligned with one another and alternate across the width of reaction space 340. As such, the sets of slits 216a and 216b do not form two separate alignments that are parallel to each other, as in FIG. 6A. As such, neither of the two sets of slits is upstream or downstream of the other. In this embodiment, each of the adjustable gas injectors 212 is configured to inject one of the first and second gases into reaction space 370 as discussed in FIG. 6A. In this way, the two gases intermix in one effective gas curtain 371, comprising the plurality of gas jets 370 from the slits 216a, 216b. Said gas curtain is injected into and across the width of reaction space 340.

From the mixing space 342, the gas curtain 371 changes direction, flowing horizontally towards substrate 80. As such, the first and second gases preferably follow a shared or common flow path from mixing space 342, through channel 341, through and away from opening 343f, and over a substrate support 350, which is sized and shaped to support the substrate 80 (FIGS. 3-5). In a CVD process, the two gases react together to deposit a layer of material onto the substrate. Excess gases and by-products continue along the common flow path to the exhaust flange 360. In an embodiment, the common flow path may be vertical. In certain embodiments, the common flow path of the two gases is laminar and/or horizontal. As such, the width of mixing space 342 is perpendicular to the direction of gas flow of the first and second gases. The width of mixing space 342, and thus the width of the portion of the reaction space 340 containing the mixing space 342, can be greater than or equal to the width of the substrate 80.

Referring again to FIGS. 4A and 5A, slits 216a and 216b can be positioned at different distances relative to a bottom wall 343d of channel 341. For example, slits 216a can be positioned closer to the bottom wall 343d of channel 341, and slits 216b can be positioned further therefrom or vice versa. In the embodiments shown, slits 216a and 216b are positioned at the wall 343a of channel 341, at the same distance from the bottom wall 343d. In this way, the first and second inlet sets, or the first and second sets of slits 216a and 216b, are disposed on the same wall of mixing space 342. As such, the first and second inlet sets direct reactants from the reactant sources 10, 20 in a common direction into the mixing space 342 and reaction space 340.

As illustrated in FIG. 3, the substrate 80 is located within the reaction space 340, and the reactant gases may flow freely without being subjected to any flow restrictions from the mixing space 342 to the substrate 80. The lack of flow restrictions means that the reactant gases are not subjected to increased pressure at the mixing space, where gas interaction is possible. Accordingly, premature semiconductor deposition or other unwanted (e.g., explosive), reactions can be avoided. The pressure differential may be substantially zero between the mixing space 342 and the substrate 80. In some embodiments, however, the pressure differential may be negative, which is to say the pressure may decrease between the mixing space 342 and the substrate 80. Total pressure in the reaction space 340 may be between 1 Torr and 200 Torr.

In some modes of operation, gas from the first reactant source 10 and gas from the second reactant source 20 are introduced sequentially into the reaction space 340 such that the reactants from the reactant sources 10, 20 are not intended to mix during processing. The illustrated separate flow paths still reduce the risk of explosive interaction between reactants for such sequential modes of operation. Because the illustrated injector housing 500 keeps the flow paths for the gases separate until they intersect at the mixing space 342, there is no danger that residual reactant from one pulse will interact with a subsequent pulse of the other reactant within the confines of the gas panel 100 (FIG. 2) or within manifold 200.

In other modes of operation, the gases are introduced simultaneously into the reaction space 340 and actually mix and interact during selective deposition. As the precursors and etchants mix within the reaction space, under lower pressures and in a larger volume than the upstream gas panel 100 (FIG. 2) and manifold 200, there is less risk of damage to equipment from violent reactions. Preferably, conditions are selected to maintain 100% selectivity, for example, zero net deposition over insulating surfaces and some net epitaxial deposition over single crystal semiconductor windows.

In some processes, temperature in the reaction space 340 is below about 750° C., and particularly between about 500° C. and about 600° C. Thus, temperature control of manifold 200 may be desirable. Referring again to FIG. 6, manifold 200 may comprise a fluid supply line 344 and fluid return line 345 in fluid communication with a temperature control channel 346 extending through manifold 200. In this illustrated embodiment, lines 344, 345 and channel 346 are configured to provide temperature control of manifold 200 by circulating a temperature control fluid therethrough. This temperature control fluid can comprise many different types of fluids, such as a coolant comprising propylene glycol mixed with water. This process may be effectuated by means of a chiller system (not shown) or similar system known in the art in communication with lines 344, 345. It is understood that channel 346 can be configured in many different ways, although here it is a plurality of horizontal channels 346a in communication with a plurality of vertical channels 346b.

Referring to FIG. 2, the above-described simultaneous and sequential modes of operation can be implemented by instructions or programming of a controller 250. The controller 250, which can include a general purpose or special purpose computer, can communicate with devices on the gas panel 100, such as valves and mass flow controllers, as well as flow control devices at other locations. For example, one or more of the sources 10, 20 can have control valves and heaters in communication with the controller 250, and the injectors 212 can be computer-controlled as mentioned above. The controller 250 can also adjust other devices that affect processing parameters, such as a temperature control system, which in turn receives input from temperature sensors and adjusts power to heaters (e.g. radiant heaters outside the chamber 300), and the vacuum pump 362. The controller 250 can thus be programmed to implement process recipes, such as the simultaneous or the sequential selective epitaxial formation processes described above.

The skilled artisan will appreciate that some of the advantages of the equipment and processes taught herein will be obtained with other geometric configurations, and that various alterations of these geometric configurations might present different advantages. For example, FIGS. 2-6 show manifold 200 with gas injectors 212 aligned substantially linearly and distributed substantially evenly across the width of housing 500, while alternating between the first and second sets 212a, 212b. As such, the injectors in this embodiment are accessible from a common direction relative to housing 500.

Figure 7:
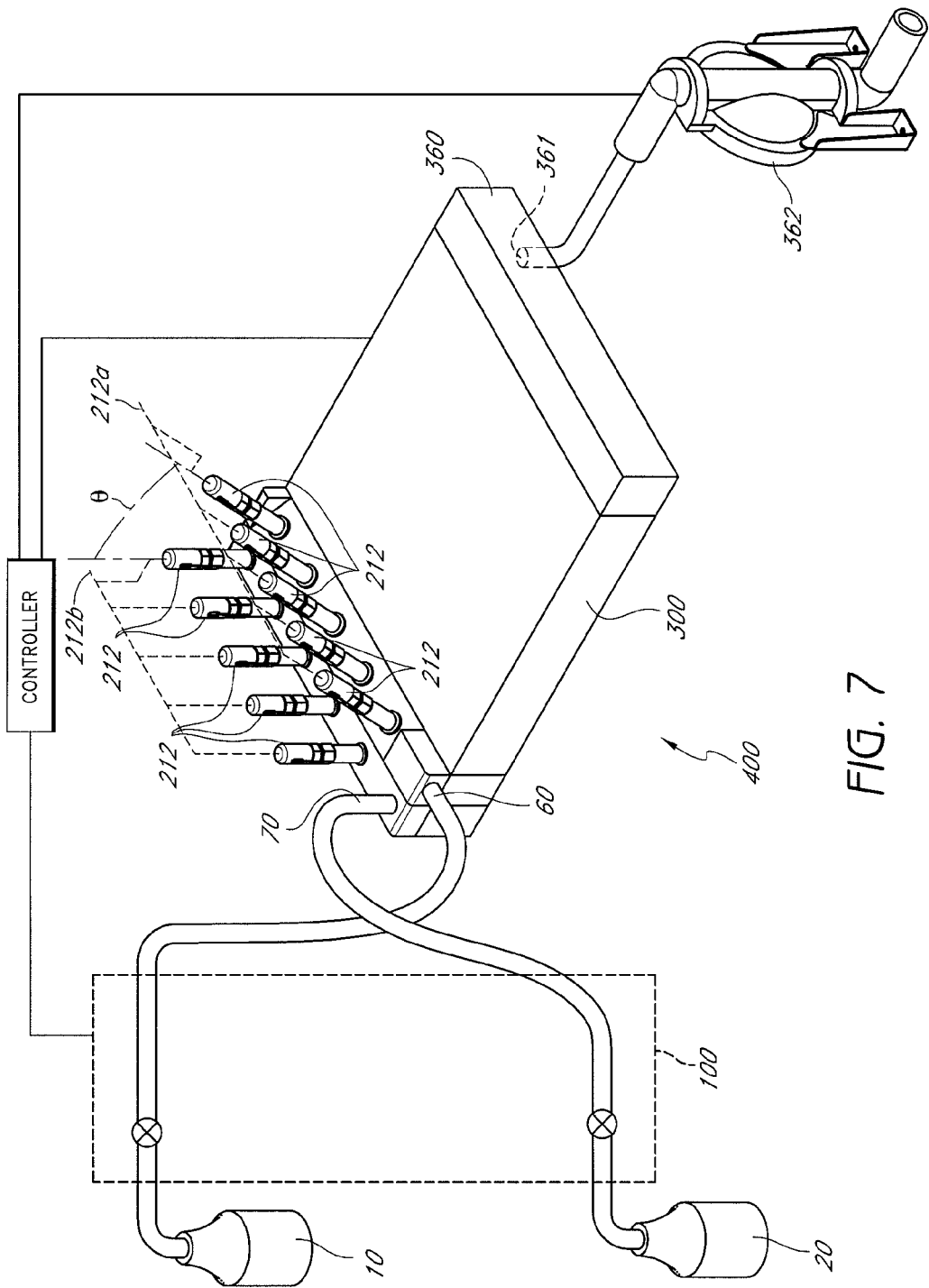
FIG. 7 is a schematic diagram of a system for processing substrates in accordance with an embodiment.

As shown in FIG. 7, it may be desirable in other embodiments to configure manifold 200 such that the first and second sets of gas injectors 212a, 212b are configured at an angle θ relative to each other. Angle θ is an angle between the first and second sets of gas injectors 212a, 212b, and does not imply that either set is oriented in any particular direction. For example, the angle θ can vary from zero degrees to 180 degrees. While the first set of adjustable injectors 212a is shown oriented at an angle θ relative to a vertically oriented second set of adjustable injectors 212b, the first set of injectors 212a could alternatively be vertical with the second set of injectors 212b oriented at an angle θ relative thereto. In various embodiments, θ can be 30°-60°, 75°-105°, or 165°-195°. The angle θ is preferably at least 30 degrees. In the embodiment shown in FIG. 7, angle θ is approximately 45 degrees. As such, the first and second sets of gas injectors 212a, 212b in this embodiment can be accessed from different directions relative to the housing 500.

Figure 8:
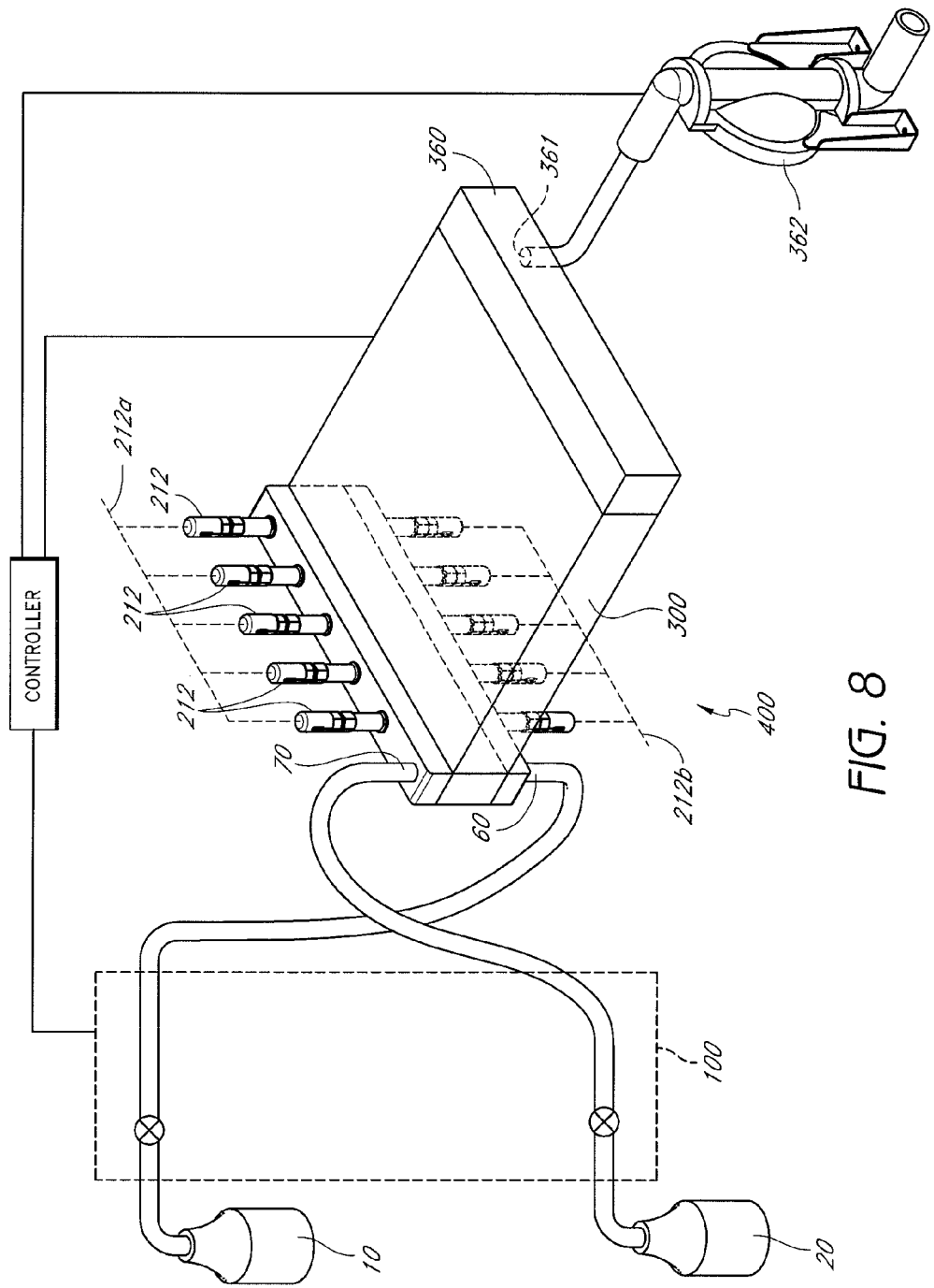
FIG. 8 is a schematic diagram of a system for processing substrates in accordance with an embodiment.
Figure 9:
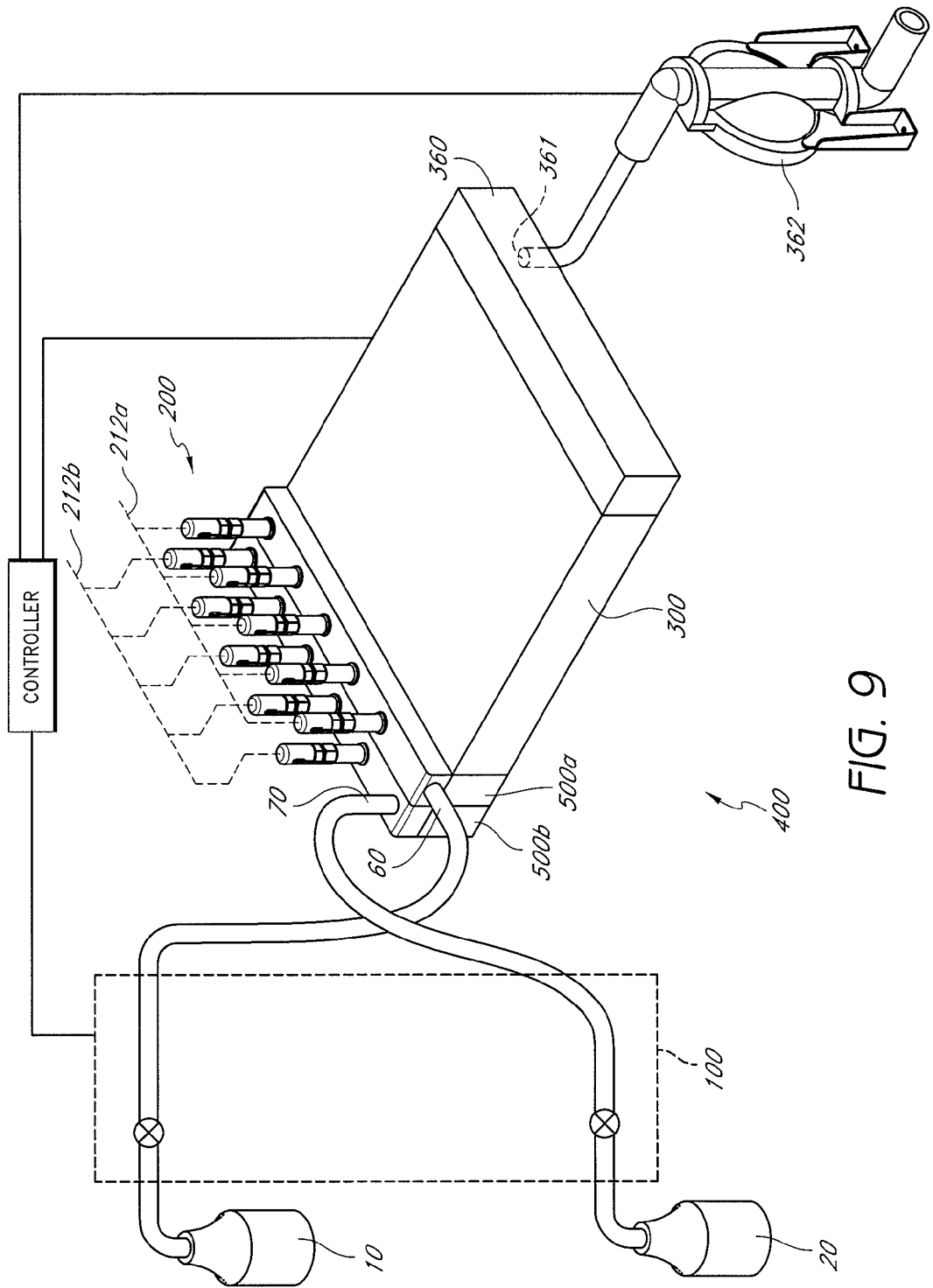
FIG. 9 is a schematic diagram of a system for processing substrates comprising first and second gas injector housings in accordance with an embodiment.
Figure 10:
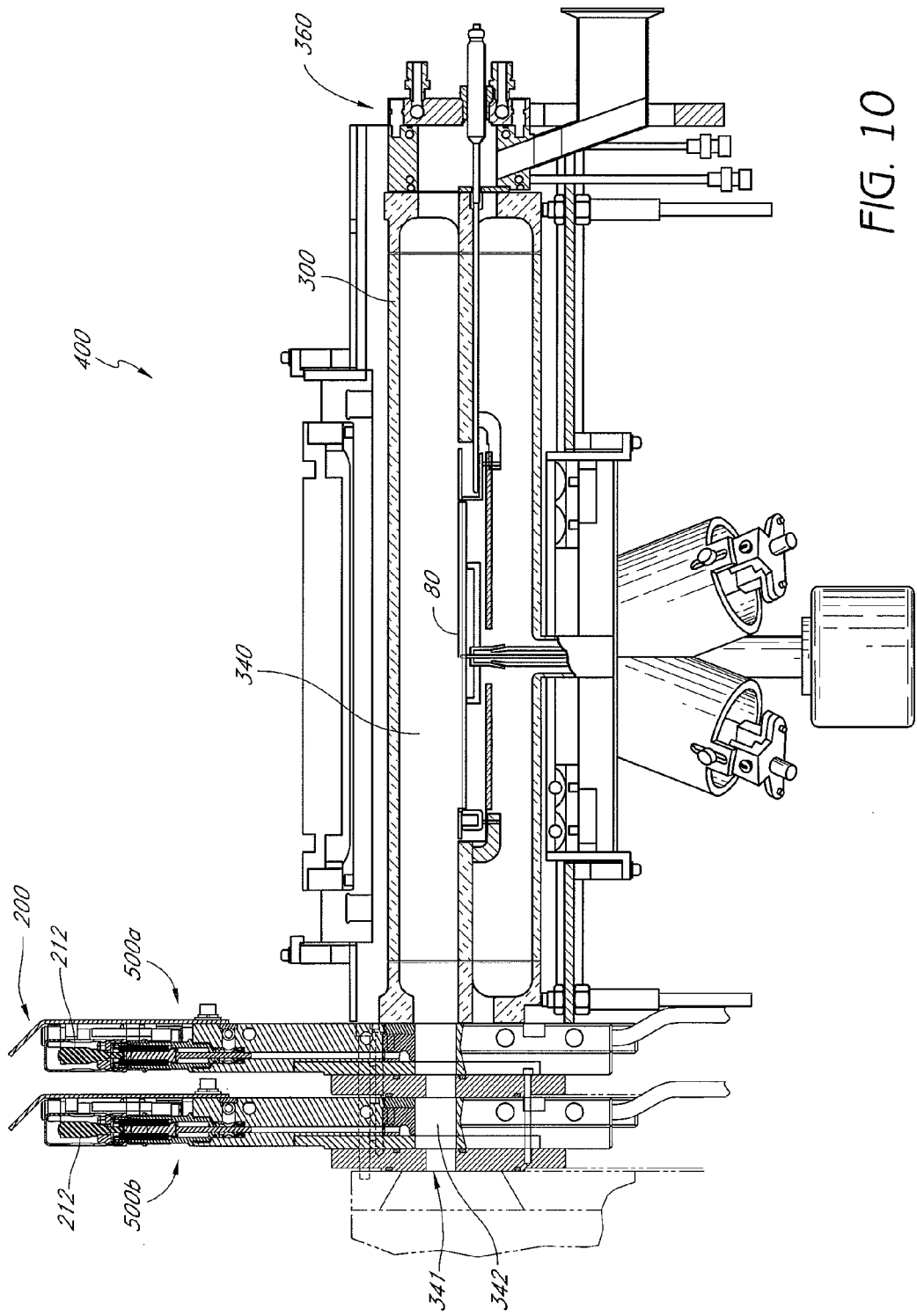
FIG. 10 is a cross sectional side view of the system of FIG. 9 in accordance with an embodiment.

FIGS. 8-10 illustrate other geometric configurations of the equipment and processes taught herein. FIG. 8 shows an embodiment with the first and second sets of gas injectors 212a, 212b positioned on manifold 200 such that the angle θ is approximately 180 degrees. In this illustrative embodiment, gas injectors 212a, 212b are configured such that they can be accessed from generally opposing directions relative to housing 500. In yet another embodiment shown in FIGS. 9 and 10, manifold 200 comprises first and second gas injector housings 500a and 500b, one downstream of the other, with corresponding first and second gas delivery paths (similar to paths 512a and 512b of FIGS. 4-6), respectively, extending therethrough. In this embodiment, housings 500a and 500b at least partially contain the first and second sets of adjustable gas injectors 212a and 212b, respectively, as shown. As such, this embodiment comprises the separate first and second gas delivery paths to respectively deliver first and second gases to mixing space 342 and reaction space 340, as discussed above, but may reduce equipment manufacturing costs by avoiding the manufacture of the specialized injector housings in the foregoing figures, in favor of two standard injector housings for the two different gases.

The foregoing embodiments provide methods and equipment for separately providing precursors for semiconductor deposition and etchants that provide selectivity. The first intersection, or mixing space, for these two reactants is within the relatively spacious reaction space, rather than upstream manifolds and gas panels. By avoiding interaction within the tight confines of portion flow paths upstream of the reaction space, potentially harmful reactions are avoided or such reactions take place within the reaction space where reactions are not confined to a small volume, pressures can be kept lower, and less damage is incurred. Advantages are obtained whether the precursors and etchants for selective film formation are supplied simultaneously or in sequential steps.

Although this invention has been disclosed in the context of certain embodiments and examples, it will be understood by those skilled in the art that the present invention extends beyond the specifically disclosed embodiments to other alternative embodiments and/or uses of the invention and obvious modifications thereof. Thus, it is intended that the scope of the present invention herein disclosed should not be limited by the particular disclosed embodiments described above, but should be determined only by a fair reading of the claims that follow.

We claim:

1. A reactor for processing substrates, comprising:
   a substantially rectangular, horizontal flow reaction chamber comprising a first side and an opposite second side;
   a substrate support configured for supporting a substrate with a major surface exposed, the substrate support positioned inside the reaction chamber between the first side and the second side of the reaction chamber;
   a first set of adjustable gas injectors configured to inject a first gas from a first reactant source into a mixing space and control a gas flow profile of the first gas into the mixing space;
   a second set of adjustable gas injectors configured to inject a second gas from a second reactant source into the mixing space and control a gas flow profile of the second gas into the mixing space, wherein the first set of adjustable gas injectors includes no common gas injectors with the second set of adjustable gas injectors, and wherein the first and second sets of adjustable gas injectors are disposed on a common wall extending along a portion of the mixing space and are positioned on the first side of the reaction chamber;
   wherein the reactor is configured so that the first and second gases first mix together at the mixing space to form a gas mixture and form a substantially unidirectional common flow path of the gas mixture from the mixing space to the substrate support, the common flow path having no flow restrictions between the mixing space and the substrate support; and
   an outlet configured to allow flow from the reaction chamber, wherein the outlet is positioned on the second side of the reaction chamber.

2. The reactor of claim 1,
   wherein the first and second gases comprise a precursor for vapor deposition and a vapor etchant, respectively.

3. The reactor of claim 2, wherein the precursor comprises trisilane ($Si_3H_8$) and the etchant comprises diatomic chlorine ($Cl_2$).

4. The reactor of claim 2, wherein the precursor comprises a silane and the etchant comprises hydrogen chloride (HCl).

5. The reactor of claim 1, further comprising an injector housing at least partially containing the first and second sets of injectors.

6. The reactor of claim 1, further comprising:
   a first injector housing at least partially containing the first set of injectors; and
   a second injector housing at least partially containing the second set of injectors.

7. The reactor of claim 5, wherein the first and second sets of injectors can be accessed from a common direction relative to the housing.

8. The reactor of claim 5, wherein the first and second sets of injectors can be accessed from different directions relative to the housing, said different directions separated by at least 30 degrees.

9. The reactor of claim 5, wherein the first and second sets of injectors can be accessed from generally opposing directions relative to the housing.

10. The reactor of claim 1, wherein the substrate support is configured to support a substrate of a particular diameter, the mixing space having a width perpendicular to a direction of the common flow path, said width being greater than or equal to the diameter of the substrate.

11. The reactor of claim 1, wherein the first and second sets of adjustable gas injectors are configured so that the first and second gases mix within a reaction space defined by the reaction chamber.

12. The reactor of claim 1, wherein each of the first and second sets of injectors is configured to inject a plurality of gas jets, each injector of each injector set configured to control a flow rate of one of the gas jets, relative to flow rates of others of the gas jets.

13. A reactor for processing substrates, comprising:
   a horizontally elongated, horizontal flow reaction chamber defining a reaction space, the reaction chamber comprising a first end and a second end opposite the first end;
   a substrate support configured for supporting a substrate with a major surface exposed inside the reaction chamber, the substrate support positioned between the first end and the second end;
   a first set of adjustable gas injectors configured to inject the first gas from a first reactant source into the reaction space and control a gas flow profile of the first gas into the reaction space;
   a second set of adjustable gas injectors configured to inject the second gas from a second reactant source into the reaction space and control a gas flow profile of the second gas into the reaction space, wherein the first set of adjustable gas injectors includes no common gas injectors with the second set of adjustable gas injectors, and wherein the first set of adjustable gas injectors and the second set of adjustable gas injectors are disposed on a common wall extending along a portion of the reaction space and are positioned at the first end of the reaction chamber, wherein each of the first and the second set of adjustable gas injectors comprise three or more substantially collinear adjustable gas injectors; and
   an outlet configured to allow flow from the reaction chamber, wherein the outlet is positioned at the second end of the reaction space, such that the first and second sets of adjustable gas injectors and the outlet define a flow path for the first gas and the second gas across the substrate support, the flow path being predominantly horizontal and parallel to the exposed major surface of the substrate;
   wherein the first and second gases initially mix within the reaction space.

14. The reactor of claim 13,
   wherein the first and second gases comprise a precursor for vapor deposition and a vapor etchant, respectively.

15. The reactor of claim 14, wherein the precursor comprises trisilane ($Si_3H_8$) and the etchant comprises diatomic chlorine ($Cl_2$).

16. The reactor of claim 14, wherein the precursor comprises a silane and the etchant comprises hydrogen chloride (HCl).

17. The reactor of claim 13, further comprising an injector housing at least partially containing the first and second sets of injectors.

18. The reactor of claim 13, further comprising:
- a first injector housing at least partially containing the first set of injectors; and
- a second injector housing at least partially containing the second set of injectors.

19. The reactor of claim 17, wherein the first and second sets of injectors can be accessed from a common direction relative to the housing.

20. The reactor of claim 17, wherein the first and second sets of injectors can be accessed from different directions relative to the housing, said different directions separated by at least 30 degrees.

21. The reactor of claim 17, wherein the first and second sets of injectors can be accessed from generally opposing directions relative to the housing.

22. The reactor of claim 13, further comprising a mixing space within the reaction space, wherein the first and second gases mix at the mixing space and form the flow path from the mixing space to the substrate support, wherein the flow path has no restrictions between the mixing space and the substrate support.

23. The reactor of claim 13, wherein the substrate support is configured to support a substrate of a particular diameter, the mixing space having a width perpendicular to a direction of gas flow of the first and second gases, said width being greater than or equal to the diameter of the substrate.

24. An apparatus for selectively forming a semiconductor film on a substrate, the apparatus comprising:
- a horizontal flow chemical vapor deposition (CVD) reactor comprising a reaction space and an outlet configured to allow flow from the reaction space;
- a substrate support configured for supporting a substrate with a major surface exposed, the substrate support positioned within the reaction space between a first side of the reaction space and an opposite second side of the reaction space;
- a first inlet set of two or more inlets in fluid communication with the reaction space;
- a second inlet set of two or more inlets in fluid communication with the reaction space;
- a first reactant source configured to supply a precursor for semiconductor deposition to the first inlet set; and
- a second reactant source configured to supply an etchant to the second inlet set, wherein the inlet sets and sources define separate flow paths for the precursor and the etchant to a mixing space within the reaction space, the apparatus configured such that the precursor and etchant initially mix together within the mixing space, wherein the first and second inlet sets are disposed on a common wall extending along a portion of the mixing space and are positioned on the first side of the reaction space, each of the inlets opening directly into the mixing space, wherein the inlets are commonly aligned with respect to each other to direct the precursor and the etchant in a common direction from the common wall into the mixing space;

wherein the outlet is positioned on the second side of the reaction space such that the first and second inlet sets and the outlet define a flow path for the precursor and etchant across the substrate support, the flow path being predominantly horizontal and parallel to the exposed major surface of the substrate.

25. The apparatus of claim 1, wherein the first set of adjustable gas injectors controls the gas flow profile of the first gas across a width of the mixing space, and the second set of adjustable gas injectors controls the gas flow profile of the second gas across the width of the mixing space, the width of the mixing space being greater than or equal to a diameter of a substrate that the substrate support is designed to support.

26. The apparatus of claim 13, wherein the first set of adjustable gas injectors controls the gas flow profile of the first gas across a width of the reaction space, and the second set of adjustable gas injectors controls the gas flow profile of the second gas across the width of the reaction space.

27. The apparatus of claim 1, wherein the injectors of the first set of adjustable gas injectors are configured to emit gas jets oriented substantially in parallel with each other, and the injectors of the second set of adjustable gas injectors are configured to emit gas jets oriented substantially in parallel with each other.

28. The apparatus of claim 13, wherein the injectors of the first set of adjustable gas injectors are configured to emit gas jets oriented substantially in parallel with each other, and the injectors of the second set of adjustable gas injectors are configured to emit gas jets oriented substantially in parallel with each other.

29. The apparatus of claim 13, wherein the first and second sets of adjustable gas injectors are configured to inject at least one gas curtain into and across a width of the reaction space.

* * * * *

UNITED STATES PATENT AND TRADEMARK OFFICE
CERTIFICATE OF CORRECTION

PATENT NO.        : 8,486,191 B2
APPLICATION NO.   : 12/420010
DATED             : July 16, 2013
INVENTOR(S)       : Aggarwal et al.

It is certified that error appears in the above-identified patent and that said Letters Patent is hereby corrected as shown below:

On the Title Page, Item (56)
    Under Other Publications, page 4, column 1, line 22, please replace "(ethylmethylarnino)" with -- (ethylmethylamino) --.
    Under Other Publications, page 4, column 1, line 49, please replace "psuedomorphic" with -- pseudomorphic --.
    Under Other Publications, page 4, column 1, line 62, please replace "Filims" with -- Films --.
    Under Other Publications, page 4, column 1, line 71, please replace "diffusin" with -- diffusion --.
    Under Other Publications, page 4, column 2, line 68, please replace "eoitaxial" with -- epitaxial --.

In the Specification
    In column 10, line 15, please replace "cyclohelptatrien" to -- cycloheptatrien --.

In the Claims
    In Claim 25, column 20, line 19, please replace "The apparatus of" with -- The reactor of --.
    In Claim 26, column 20, line 26, please replace "The apparatus of" with -- The reactor of --.
    In Claim 27, column 20, line 31, please replace "The apparatus of" with -- The reactor of --.
    In Claim 28, column 20, line 37, please replace "The apparatus of" with -- The reactor of --.
    In Claim 29, column 20, line 43, please replace "The apparatus of" with -- The reactor of --.

Signed and Sealed this
Twenty-second Day of April, 2014

Michelle K. Lee
*Deputy Director of the United States Patent and Trademark Office*